US009413246B2

(12) United States Patent
Luo et al.

(10) Patent No.: US 9,413,246 B2
(45) Date of Patent: Aug. 9, 2016

(54) SYSTEMS AND METHODS FOR REGULATING POWER CONVERSION SYSTEMS WITH OUTPUT DETECTION AND SYNCHRONIZED RECTIFYING MECHANISMS

(71) Applicant: ON-BRIGHT ELECTRONICS (SHANGHAI) CO., LTD., Shanghai (CN)

(72) Inventors: Qiang Luo, Shanghai (CN); Yaming Cao, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 51 days.

(21) Appl. No.: 14/248,201

(22) Filed: Apr. 8, 2014

(65) Prior Publication Data
US 2014/0218976 A1  Aug. 7, 2014

Related U.S. Application Data

(63) Continuation-in-part of application No. 13/466,808, filed on May 8, 2012, now Pat. No. 8,953,342.

(30) Foreign Application Priority Data

Apr. 12, 2012  (CN) .......................... 2012 1 0118202
Mar. 13, 2014  (CN) .......................... 2014 1 0093010

(51) Int. Cl.
*H02M 3/335*  (2006.01)
*H02M 1/00*  (2006.01)
*H03K 17/30*  (2006.01)

(52) U.S. Cl.
CPC .. *H02M 3/33507* (2013.01); *H02M 2001/0032* (2013.01); *H03K 2017/307* (2013.01); *Y02B 70/16* (2013.01)

(58) Field of Classification Search
CPC ................. H02M 3/33507; H02M 2001/0032; Y02B 70/16
See application file for complete search history.

(56) References Cited

U.S. PATENT DOCUMENTS 6,069,804 A  5/2000  Ingman et al.
6,972,969 B1  12/2005  Shteynberg et al.
(Continued)

FOREIGN PATENT DOCUMENTS

CN  102231605 A  11/2011
CN  102723856 A  10/2012
(Continued)

OTHER PUBLICATIONS

United States Patent and Trademark Office, Office Action mailed Jun. 9, 2015, in U.S. Appl. No. 14/542,443.
(Continued)

*Primary Examiner* — Jue Zhang
(74) *Attorney, Agent, or Firm* — Jones Day

(57) ABSTRACT

System and method for regulating a power conversion system. An example system controller includes: a first controller terminal and a second controller terminal. The system controller is configured to: receive an input signal at the first controller terminal and generate a first drive signal at the second controller terminal based on at least information associated with the input signal to turn on or off a transistor to affect a current associated with a secondary winding of the power conversion system. The system controller is further configured to: in response to the input signal changing from a first value larger than a first threshold to a second value smaller than the first threshold, change the first drive signal from a first logic level to a second logic level to turn on the transistor.

24 Claims, 13 Drawing Sheets

(56) References Cited

U.S. PATENT DOCUMENTS

| | | | |
|---|---|---|---|
| 7,173,835 B1 | 2/2007 | Yang | |
| 7,447,049 B2 | 11/2008 | Garner et al. | |
| 7,768,801 B2 | 8/2010 | Usui et al. | |
| 7,826,237 B2 | 11/2010 | Zhang et al. | |
| 7,952,894 B2 | 5/2011 | Lin et al. | |
| 8,102,676 B2 | 1/2012 | Huynh et al. | |
| 8,542,507 B2 * | 9/2013 | Hsu | H02M 3/33592 363/21.14 |
| 8,570,772 B2 * | 10/2013 | Morris | H02M 1/32 363/21.14 |
| 8,953,342 B2 * | 2/2015 | Fang | H02M 3/33507 363/21.14 |
| 2005/0024897 A1 | 2/2005 | Yang et al. | |
| 2006/0018135 A1 | 1/2006 | Yang et al. | |
| 2007/0139095 A1 | 6/2007 | Fang et al. | |
| 2009/0168464 A1 * | 7/2009 | Lin | H02M 3/33592 363/21.06 |
| 2009/0322300 A1 * | 12/2009 | Melanson | H02M 1/1563 323/284 |
| 2010/0219802 A1 * | 9/2010 | Lin | H02M 3/33507 323/284 |
| 2011/0002145 A1 | 1/2011 | Halberstadt | |
| 2013/0235620 A1 | 9/2013 | Morris et al. | |
| 2013/0258723 A1 | 10/2013 | Fang et al. | |
| 2013/0272036 A1 | 10/2013 | Fang | |
| 2014/0021786 A1 | 1/2014 | Fang | |
| 2015/0070944 A1 | 3/2015 | Fang | |
| 2015/0229223 A1 | 8/2015 | Cao et al. | |

FOREIGN PATENT DOCUMENTS

| | | | |
|---|---|---|---|
| CN | 103728572 A | | 4/2014 |
| CN | 103378751 | | 4/2015 |
| EP | 2525480 A1 | | 11/2012 |
| JP | 2009278717 A | | 11/2009 |
| TW | 201234854 A | | 8/2012 |
| TW | I 509971 | | 11/2015 |

OTHER PUBLICATIONS

United States Patent and Trademark Office, Office Action mailed Dec. 3, 2015, in U.S. Appl. No. 14/542,443.

Beijing East IP LTD., Statement attached with Mailing List, submitted to the State Intellectual Property Office of China on Nov. 18, 2015, requesting correction of the filing date for Chinese Patent Application No. 201210118202.7.

State Intellectual Property Office of China, Formal Letter of Examination issued Dec. 2, 2015, in Application No. 201210118202.7.

State Intellectual Property Office of China, print-out of bibliographic data from http://cpquery.sipo.gov.cn of Chinese Patent Application No. 201210118202.7, dated Feb. 25, 2016.

United States Patent and Trademark Office, Office Action mailed Mar. 1, 2016, in Application No. 14/14/602,944.

United States Patent and Trademark Office, Office Action mailed May 10, 2016, in U.S. Appl. No. 14/542,443.

* cited by examiner

US 9,413,246 B2

SYSTEMS AND METHODS FOR REGULATING POWER CONVERSION SYSTEMS WITH OUTPUT DETECTION AND SYNCHRONIZED RECTIFYING MECHANISMS

1. CROSS-REFERENCES TO RELATED APPLICATIONS

This application claims priority to Chinese Patent Application No. 201410093010.4, filed Mar. 13, 2014, incorporated by reference herein for all purposes. In addition, this application is a continuation-in-part of U.S. patent application Ser. No. 13/466,808, filed May 8, 2012, claiming priority to Chinese Patent Application No. 201210118202.7, filed Apr. 12, 2012, both of these applications commonly assigned and incorporated by reference herein for all purposes.

2. BACKGROUND OF THE INVENTION

The present invention is directed to integrated circuits. More particularly, the invention provides systems and methods with output detection and synchronized rectifying mechanisms. Merely by way of example, the invention has been applied to a power conversion system. But it would be recognized that the invention has a much broader range of applicability.

FIG. 1 is a simplified diagram showing a conventional flyback power conversion system. The power conversion system 100 includes a primary winding 110, a secondary winding 112, a power switch 120, a current sensing resistor 122, a rectifying diode 124, a capacitor 126, an isolated feedback component 128, and a controller 102. The controller 102 includes an under-voltage-lockout component 104, a pulse-width-modulation generator 106, a gate driver 108, a leading-edge-blanking (LEB) component 116, and an over-current-protection (OCP) component 114. For example, the power switch 120 is a bipolar transistor. In another example, the power switch 120 is a field effect transistor.

The power conversion system 100 implements a transformer including the primary winding 110 and the secondary winding 112 to isolate an AC input voltage 190 on the primary side and an output voltage 192 on the secondary side. The isolated feedback component 128 processes information related to the output voltage 192 and generates a feedback signal 136. The controller 102 receives the feedback signal 136, and generates a gate-drive signal 130 to turn on and off the switch 120 in order to regulate the output voltage 192. For example, the isolated feedback component 128 includes an error amplifier, a compensation network, and an opto-coupler.

Though the fly-back power conversion system 100 can be used for output voltage regulation, the power conversion system 100 often cannot achieve good output current control without additional circuitry of high cost. Moreover, the required output current sensing resistor in the secondary side usually reduces the efficiency of the power conversion system 100.

FIG. 2(A) is a simplified diagram showing another conventional flyback power conversion system. The power conversion system 200 includes a system controller 202, a primary winding 210, a secondary winding 212, an auxiliary winding 214, a power switch 220, a current sensing resistor 230, two rectifying diodes 260 and 262, two capacitors 264 and 266, and two resistors 268 and 270. For example, the power switch 220 is a bipolar transistor. In another example, the power switch 220 is a MOS transistor.

Information related to the output voltage 250 can be extracted through the auxiliary winding 214 in order to regulate the output voltage 250. When the power switch 220 is closed (e.g., on), the energy is stored in the transformer that includes the primary winding 210 and the secondary winding 212. Then, when the power switch 220 is open (e.g., off), the stored energy is released to the secondary side, and the voltage of the auxiliary winding 214 maps the output voltage on the secondary side. The system controller 202 receives a current sensing signal 272 that indicates a primary current 276 flowing through the primary winding 210, and a feedback signal 274 that relates to a demagnetization process of the secondary side. For example, a switching period of the switch 220 includes an on-time period during which the switch 220 is closed (e.g., on) and an off-time period during which the switch 220 is open (e.g., off).

FIG. 2(B) is a simplified conventional timing diagram for the flyback power conversion system 200 that operates in the discontinuous conduction mode (DCM). The waveform 292 represents a voltage 254 of the auxiliary winding 214 as a function of time, and the waveform 294 represents a secondary current 278 that flows through the secondary winding 212 as a function of time.

For example, as shown in FIG. 2(B), a switching period, $T_s$, of the switch 220, starts at time $t_0$ and ends at time $t_3$, an on-time period, $T_{on}$, starts at the time $t_0$ and ends at time $t_1$, a demagnetization period, $T_{demag}$ starts at the time $t_1$ and ends at time $t_2$, and an off-time period, $T_{off}$, starts at the time $t_1$ and ends at the time $t_3$. In another example, $t_0 \le t_1 \le t_2 \le t_3$. In DCM, the off-time period, $T_{off}$, is much longer than the demagnetization period, $T_{demag}$.

During the demagnetization period $T_{demag}$, the switch 220 remains open, the primary current 276 keeps at a low value (e.g., approximately zero). The secondary current 278 decreases from a value 296 (e.g., at $t_1$) as shown by the waveform 294. The demagnetization process ends at the time $t_2$ when the secondary current 278 has a low value 298 (e.g., approximately zero). The secondary current 278 keeps at the value 298 for the rest of the switching period. A next switching period does not start until a period of time after the completion of the demagnetization process (e.g., at $t_3$).

As shown in FIG. 1 and FIG. 2(A), the power conversion system 100 and the power conversion system 200 each use a rectifying diode (e.g., the diode 124 in FIG. 1 and the diode 260 in FIG. 2) on the secondary side for rectification. A forward voltage of the rectifying diode is usually in a range of 0.3V-0.8V. Such a forward voltage often results in significant power loss in operation, and thus causes low efficiency of the power conversion system. For example, when a power conversion system has an output level of 5V/1 A, a rectifying diode with a forward voltage of 0.3V-0.4V causes a power loss of about 0.3 W-0.4 W at a full load (e.g., 1 A). The reduction of the system efficiency is about 4%-6%.

In addition, in order for the power conversion system 200 to achieve low standby power consumption, the switching frequency is often kept low to reduce switching loss under no load or light load conditions. However, when the power conversion system 200 changes from no/light load conditions to full load conditions, the output voltage 250 may drop abruptly and such a voltage drop may not be detected by the system controller 202 instantly because the system controller 202 can often detect the output voltage only during a demagnetization process of each switching cycle. Therefore, the dynamic performance of the power conversion system 200 is often unsatisfactory at a low switching frequency under no/light load conditions. For example, the power conversion system 200 has an output level of 5V/1 A and the output capacitor 264 has a capacitance of 1000 μF. Under no/light load conditions, the switching frequency is 1 kHz corresponding to a switching period of 1 ms. If the output load changes from no/light load conditions (e.g., 0 A) to full load conditions (e.g., 1 A), the output voltage 250 drops 1 V (e.g., from 5 V to 4 V), which is often unacceptable in certain applications.

Hence, it is highly desirable to improve techniques for rectification and output detection of a power conversion system.

3. BRIEF SUMMARY OF THE INVENTION

The present invention is directed to integrated circuits. More particularly, the invention provides systems and methods with output detection and synchronized rectifying mechanisms. Merely by way of example, the invention has been applied to a power conversion system. But it would be recognized that the invention has a much broader range of applicability.

According to one embodiment, a system controller for regulating a power conversion system includes a first controller terminal and a second controller terminal. The system controller is configured to receive at least an input signal at the first controller terminal, and generate a gate drive signal at the second controller terminal based on at least information associated with the input signal to turn on or off a transistor in order to affect a current associated with a secondary winding of the power conversion system. The system controller is further configured to, if the input signal is larger than a first threshold, generate the gate drive signal at a first logic level to turn off the transistor, and if the input signal changes from a first value larger than a second threshold to a second value smaller than the second threshold, change the gate drive signal from the first logic level to a second logic level to turn on the transistor.

According to another embodiment, a system controller for regulating a power conversion system includes a first controller terminal and a second controller terminal. The system controller is configured to receive at least an input signal at the first controller terminal, the input signal being proportional to an output voltage associated with a secondary winding of the power conversion system, and generate a gate drive signal at the second controller terminal based on at least information associated with the input signal to turn on or off a transistor in order to affect a current associated with the secondary winding of the power conversion system. The system controller is further configured to, only if the input signal changes from a first value larger than a first threshold to a second value smaller than the first threshold, generate a pulse of the gate drive signal to turn on the transistor during a pulse period associated with the pulse.

According to yet another embodiment, a system controller for regulating a power conversion system includes a first comparator, a signal detector, and a driving component. The first comparator is configured to receive an input signal and output a first comparison signal based on at least information associated with the input signal. The signal detector is configured to receive the input signal and output a first detection signal based on at least information associated with the input signal. The driving component is configured to output a gate drive signal based on at least information associated with the first comparison signal and the first detection signal to turn on or off a transistor in order to affect a current associated with a secondary winding of the power conversion system. The comparator is further configured to determine whether the input signal is larger than a first threshold. The signal detector is further configured to determine whether the input signal changes from a first value larger than a second threshold to a second value smaller than the second threshold. The driving component is further configured to, if the first comparison signal indicates the input signal is larger than the first threshold, generate the gate drive signal at a first logic level to turn off the transistor, and if the first detection signal indicates the input signal changes from the first value larger than the second threshold to the second value smaller than the second threshold, change the gate drive signal from the first logic level to a second logic level to turn on the transistor.

In one embodiment, a system controller for regulating a power conversion system includes a comparator, a pulse signal generator, and a driving component. A comparator is configured to receive an input signal and output a comparison signal based on at least information associated with the input signal. The pulse signal generator is configured to receive at least the comparison signal and generate a pulse signal based on at least information associated with the comparison signal. The driving component is configured to receive the pulse signal and generate a gate drive signal based on at least information associated with the pulse signal to turn on or off a transistor in order to affect a current associated with the secondary winding of the power conversion system. The comparator is further configured to determine whether the input signal is larger than or smaller than a threshold. The pulse signal generator is further configured to, only if the comparison signal indicates the input signal changes from a first value larger than the threshold to a second value smaller than the threshold, generate a first pulse of the pulse signal. The driving component is further configured to, in response to the first pulse of the pulse signal, generate a second pulse of the gate drive signal to turn on the transistor during a pulse period associated with the second pulse.

In another embodiment, a method for regulating a power conversion system includes receiving at least an input signal, processing information associated with the input signal, and generating a gate drive signal based on at least information associated with the input signal to turn on or off a transistor in order to affect a current associated with a secondary winding of the power conversion system. The process for generating a gate drive signal based on at least information associated with the input signal to turn on or off a transistor in order to affect a current associated with a secondary winding of the power conversion system includes, if the input signal is larger than a first threshold, generating the gate drive signal at a first logic level to turn off the transistor, and if the input signal changes from a first value larger than a second threshold to a second value smaller than the second threshold, changing the gate drive signal from the first logic level to a second logic level to turn on the transistor.

In yet another embodiment, a method for regulating a power conversion system includes receiving at least an input signal, the input signal being proportional to an output voltage associated with a secondary winding of the power conversion system, processing information associated with the input signal, and generating a gate drive signal based on at least information associated with the input signal to turn on or off a transistor in order to affect a current associated with the secondary winding of the power conversion system. The process for generating a gate drive signal based on at least information associated with the input signal to turn on or off a transistor in order to affect a current associated with the secondary winding of the power conversion system includes, only if the input signal changes from a first value larger than a first threshold to a second value smaller than the first threshold, generating a pulse of the gate drive signal to turn on the transistor during a pulse period associated with the pulse.

In yet another embodiment, a method for regulating a power conversion system includes receiving an input signal, processing information associated with the input signal, and determining whether the input signal is larger than a first threshold. The method further includes generating a comparison signal based on at least information associated with the input signal, determining whether the input signal changes from a first value larger than a second threshold to a second value smaller than the second threshold, and generating a detection signal based on at least information associated with the input signal. In addition, the method includes outputting a gate drive signal based on at least information associated with the comparison signal and the detection signal to turn on or off a transistor in order to affect a current associated with a secondary winding of the power conversion system. The process for outputting a gate drive signal based on at least information associated with the comparison signal and the detection signal to turn on or off a transistor in order to affect a current associated with a secondary winding of the power conversion system includes, if the comparison signal indicates the input signal is larger than the first threshold, generating the gate drive signal at a first logic level to turn off the transistor, and if the detection signal indicates the input signal changes from the first value larger than the second threshold to the second value smaller than the second threshold, changing the gate drive signal from the first logic level to a second logic level to turn on the transistor.

In yet another embodiment, a method for regulating a power conversion system includes receiving an input signal, processing information associated with the input signal, and determining whether the input signal is larger than or smaller than a threshold. The method further includes generating a comparison signal based on at least information associated with the first input signal, receiving the comparison signal, and processing information associated with the comparison signal. In addition, the method includes generating a pulse signal based on at least information associated with the comparison signal, receiving the pulse signal, processing information associated with the pulse signal, and generating a gate drive signal based on at least information associated with the pulse signal to turn on or off a transistor in order to affect a current associated with the secondary winding of the power conversion system. The process for generating a pulse signal based on at least information associated with the comparison signal includes, only if the comparison signal indicates the input signal changes from a first value larger than the threshold to a second value smaller than the threshold, generating a first pulse of the pulse signal. The process for generating a gate drive signal based on at least information associated with the pulse signal to turn on or off a transistor in order to affect a current associated with the secondary winding of the power conversion system includes, in response to the first pulse of the pulse signal, generate a second pulse of the gate drive signal to turn on the transistor during a pulse period associated with the second pulse.

According to one embodiment, a system controller for regulating a power conversion system includes: a first controller terminal and a second controller teiininal. The system controller is configured to: receive an input signal at the first controller terminal; and generate a first drive signal at the second controller terminal based on at least information associated with the input signal to turn on or off a transistor to affect a current associated with a secondary winding of the power conversion system. The system controller is further configured to: in response to the input signal changing from a first value larger than a first threshold to a second value smaller than the first threshold, change the first drive signal from a first logic level to a second logic level to turn on the transistor; in response to the input signal changing from the second value to a second threshold, change the first drive signal to keep the input signal approximately at the second threshold; and in response to the input signal becoming larger than a third threshold, generate the first drive signal at the first logic level to turn off the transistor.

According to another embodiment, a system for regulating a power conversion system includes: a first system controller and a second system controller. The first system controller is configured to: receive an input signal associated with an output voltage related to a secondary winding of a power conversion system; and generate a first drive signal based on at least information associated with the input signal to turn on or off a transistor to affect a first current associated with the secondary winding of the power conversion system. The second system controller configured to: receive a feedback signal associated with the first drive signal; generate a second drive signal based on at least information associated with the feedback signal; and output the second drive signal to a switch to affect a second current flowing through a primary winding of the power conversion system. The first system controller is further configured to, in response to the input signal indicating that the output voltage changes from a first value larger than a first threshold to a second value smaller than the first threshold, generate one or more pulses of the first drive signal to turn on and off the transistor. The second system controller is further configured to: process the feedback signal to detect the one or more pulses of the first drive signal; and in response to the one or more pulses of the first drive signal being detected, increase a switching frequency associated with the second drive signal. The second system controller includes: a detection component configured to receive the feedback signal, detect the one or more pulses of the first drive signal based on at least information associated with the feedback signal, and output a detection signal based on at least information associated with the detected one or more pulses, a signal generator configured to receive the detection signal and output a modulation signal based on at least information associated with the detection signal, and a drive component configured to receive the modulation signal and output the second drive signal to the switch.

In one embodiment, a method for regulating a power conversion system, the method comprising: receiving an input signal; processing information associated with the input signal; and generating a first drive signal based on at least information associated with the input signal to turn on or off a transistor to affect a current associated with a secondary winding of the power conversion system. The generating a first drive signal based on at least information associated with the input signal includes: in response to the input signal changing from a first value larger than a first threshold to a second value smaller than the first threshold, changing the first drive signal from a first logic level to a second logic level to turn on the transistor; in response to the input signal changing from the second value to a second threshold, changing the first drive signal to keep the input signal approximately at the second threshold; and in response to the input signal becoming larger than a third threshold, generating the first drive signal at the first logic level to turn off the transistor.

In another embodiment, a method for regulating a power conversion system includes: receiving an input signal associated with an output voltage related to a secondary winding of a power conversion system; processing information associated with the input signal; generating a first drive signal based on at least information associated with the input signal to turn on or off a transistor to affect a first current associated with the secondary winding of the power conversion system; receiving a feedback signal associated with the first drive signal; processing information associated with the feedback signal; generating a second drive signal based on at least information associated with the feedback signal; and outputting the second drive signal to a switch to affect a second current flowing through a primary winding of the power conversion system. The generating a first drive signal based on at least information associated with the input signal includes, in response to the input signal indicating that the output voltage changing from a first value larger than a first threshold to a second value smaller than the first threshold, generating one or more pulses of the first drive signal to turn on and off the transistor. The processing information associated with the feedback signal includes: processing the feedback signal; detecting the one or more pulses of the first drive signal based on at least information associated with the feedback signal; and outputting a detection signal based on at least information associated with the detected one or more pulses. The generating a second drive signal based on at least information associated with the feedback signal includes: receiving the detection signal; outputting a modulation signal based on at least information associated with the detection signal; receiving the modulation signal; and generating the second drive signal based on at least information associated with the modulation signal. The generating a second drive signal based on at least information associated with the feedback signal further includes, in response to the one or more pulses of the first drive signal being detected, increasing a switching frequency associated with the second drive signal.

Depending upon embodiment, one or more of these benefits may be achieved. These benefits and various additional objects, features and advantages of the present invention can be fully appreciated with reference to the detailed description and accompanying drawings that follow.

4. BRIEF DESCRIPTION OF THE DRAWINGS

Figure 7:
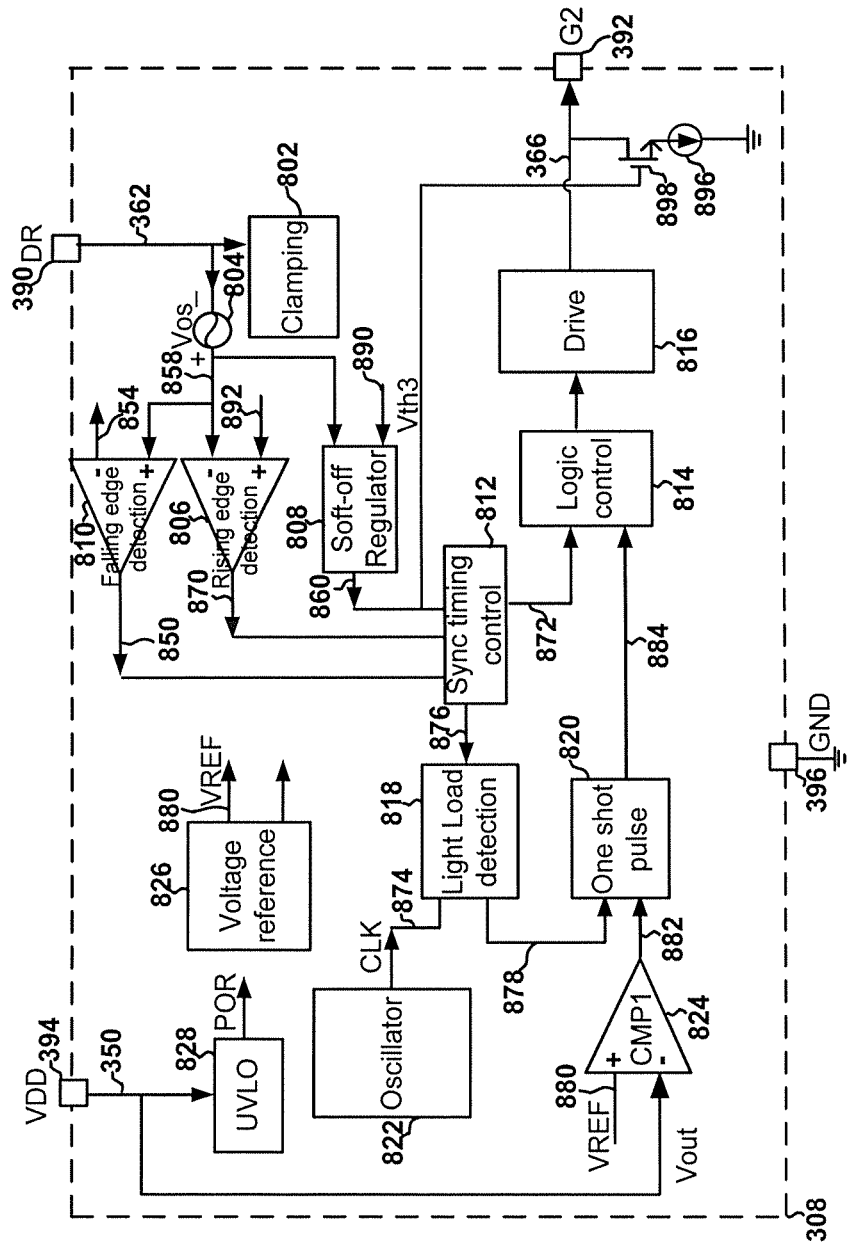
FIG. 7 is a simplified diagram showing certain components of a secondary controller as part of a power conversion system as shown in FIG. 3(A) according to another embodiment of the present invention.
Figure 8A:
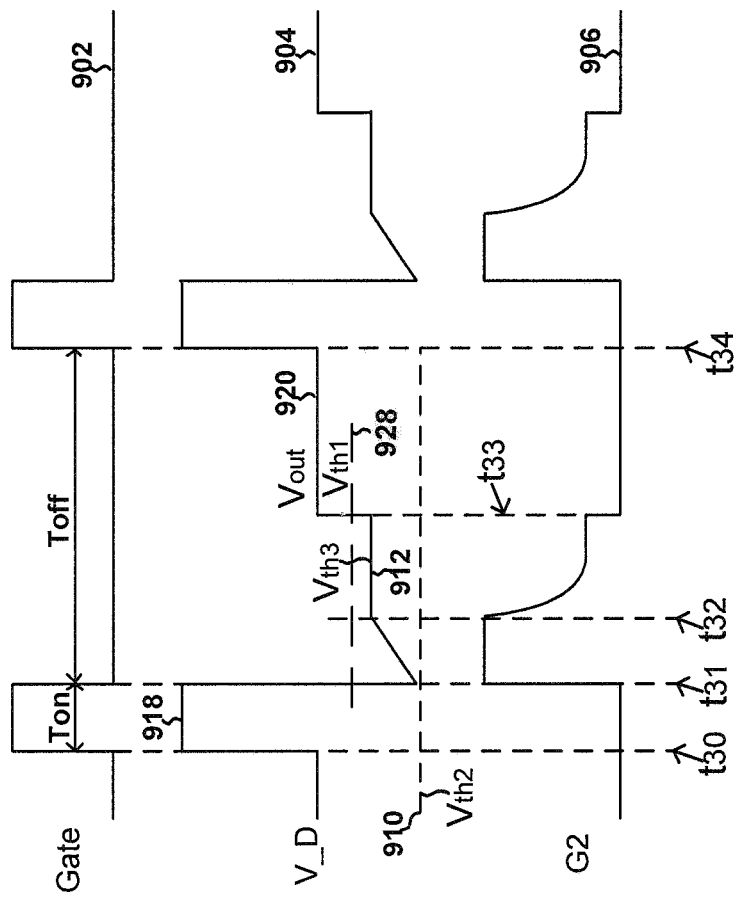
Figure 8B:
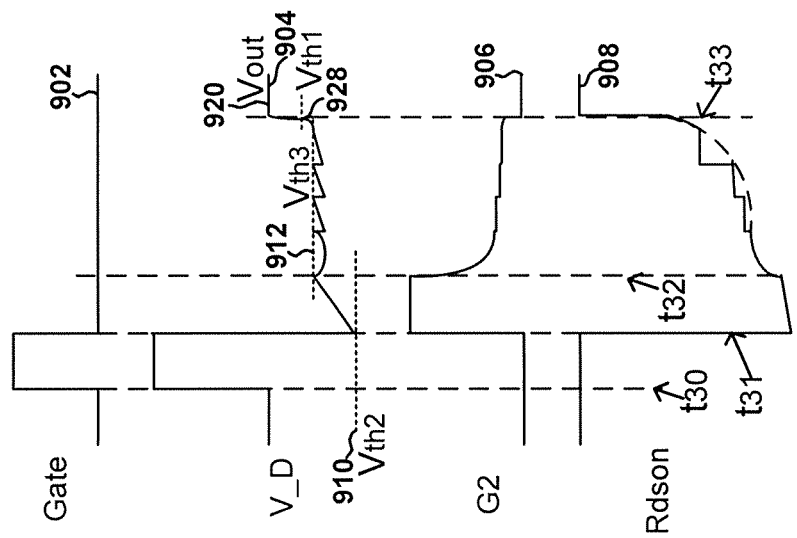

FIG. 8(A) and FIG. 8(B) are simplified timing diagrams for a power conversion system including a secondary controller as shown in FIG. 7 according to an embodiment.

Figure 1:
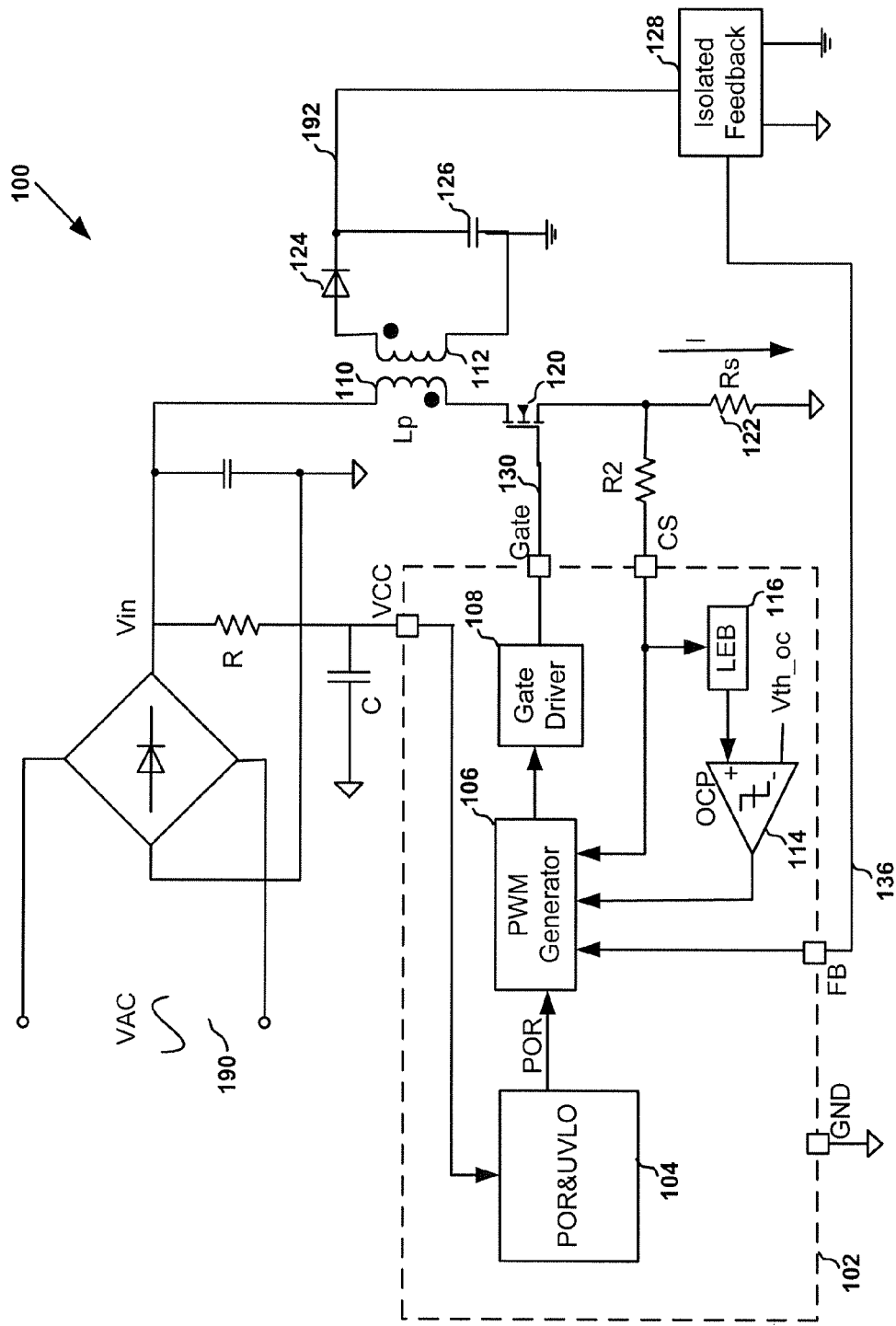
FIG. 1 is a simplified diagram showing a conventional flyback power conversion system.
Figure 2A:
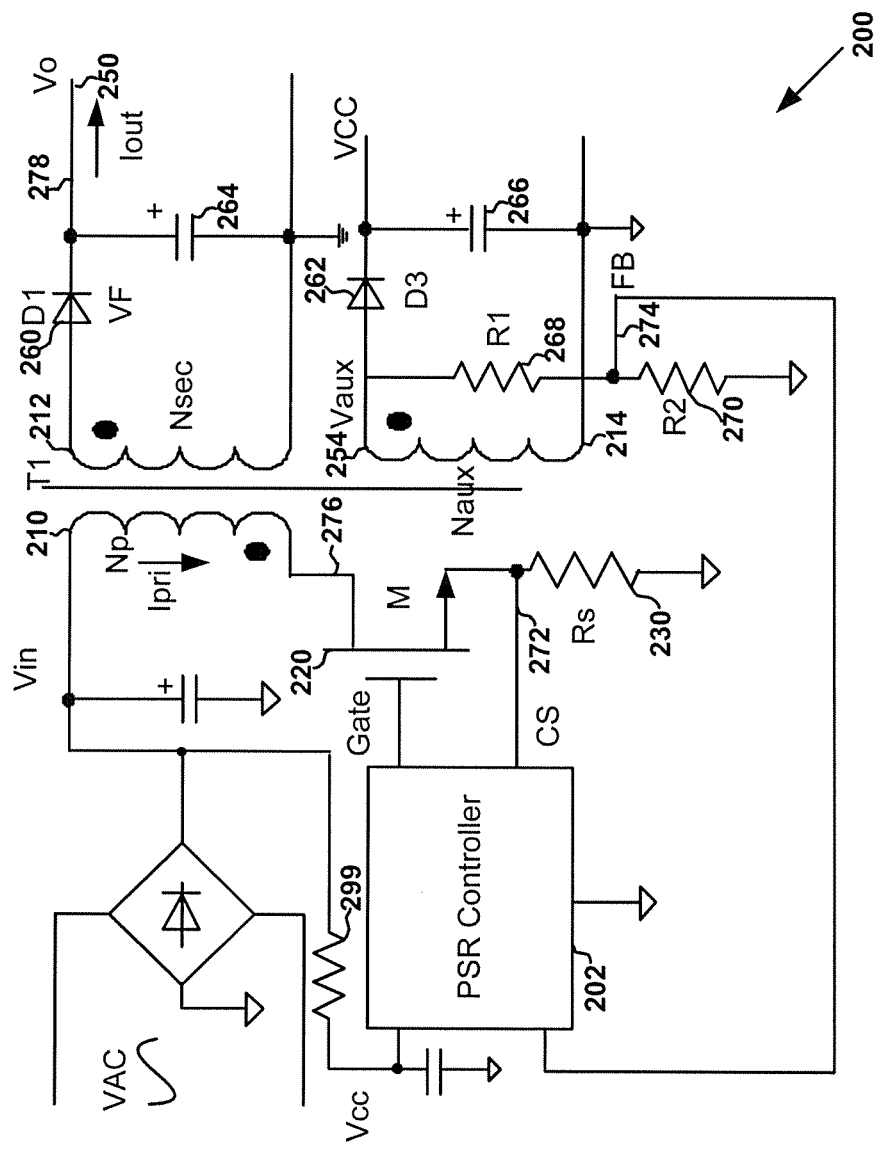
FIG. 2(A) is a simplified diagram showing another conventional flyback power conversion system.
Figure 2B:
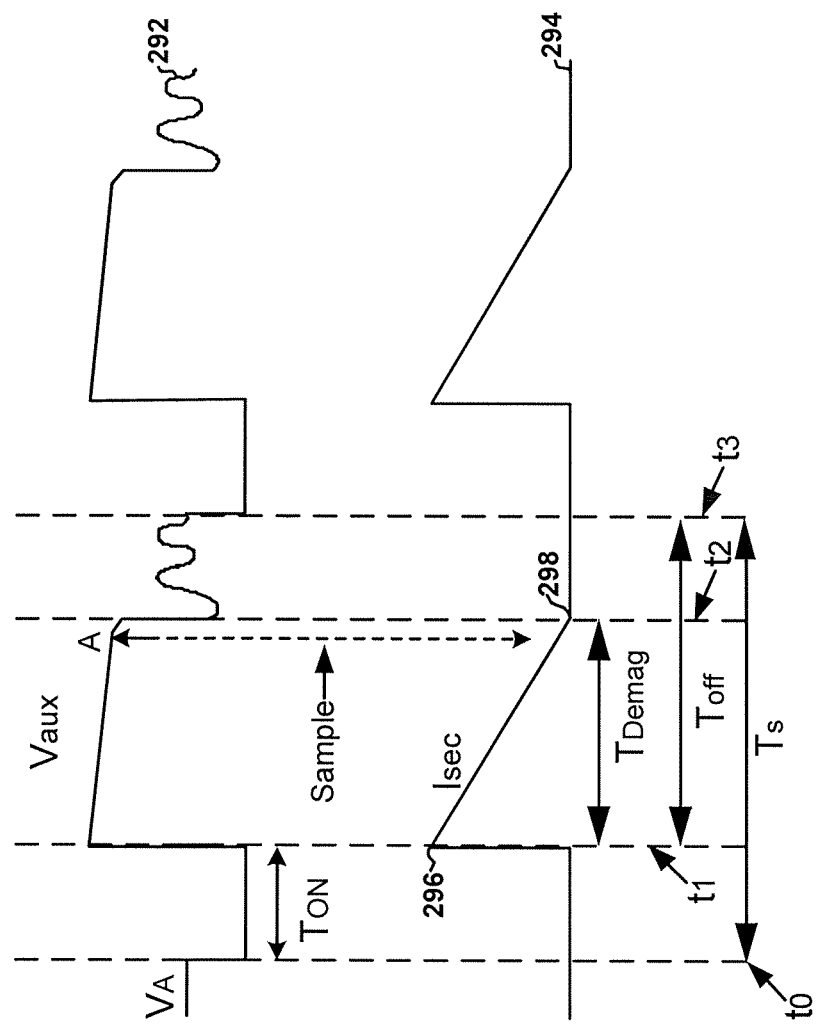
FIG. 2(B) is a simplified conventional timing diagram for the flyback power conversion system as shown in FIG. 2(A) that operates in the discontinuous conduction mode (DCM).
Figure 3A:
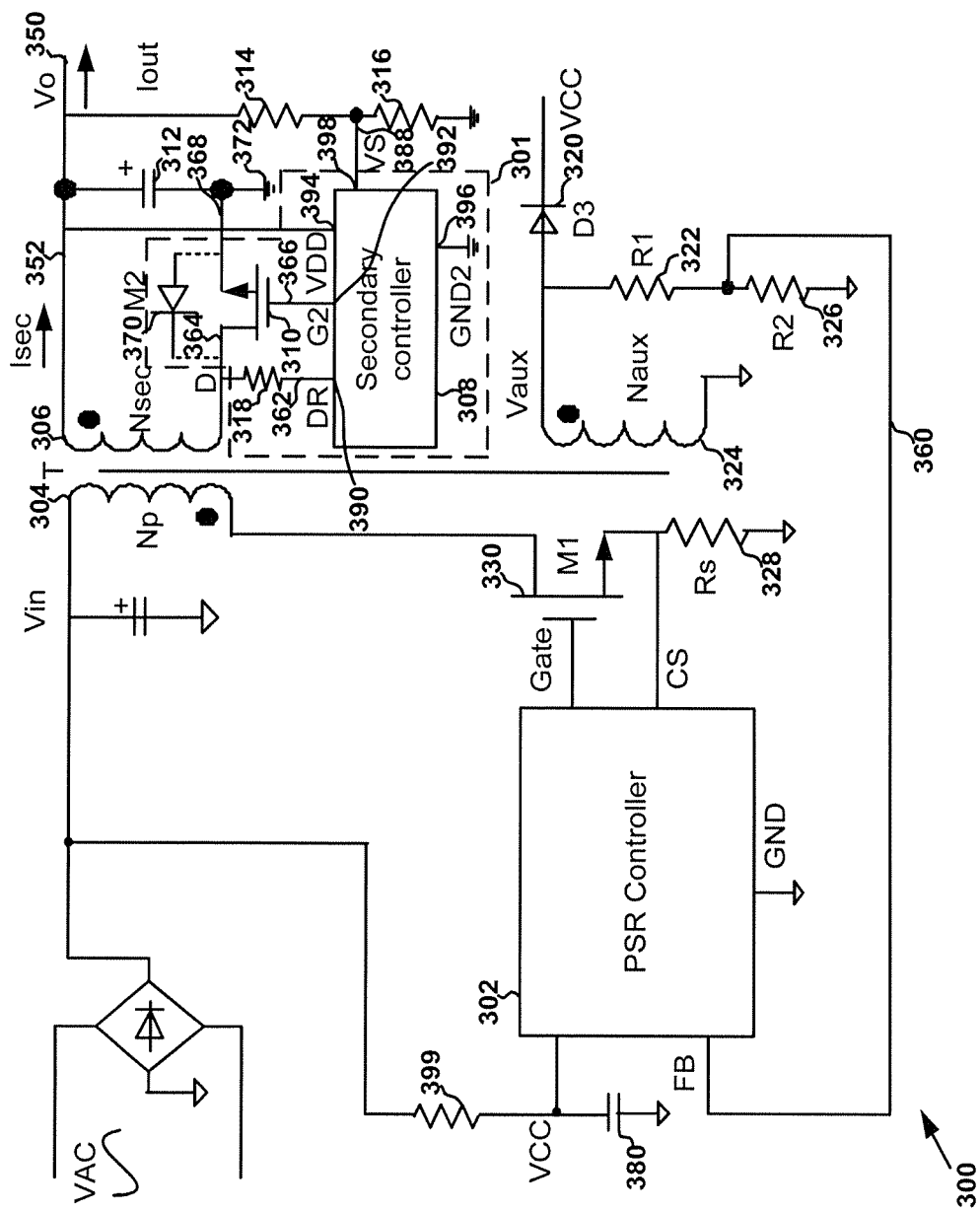
FIG. 3(A) is a simplified diagram showing a power conversion system with a rectifying circuit according to an embodiment of the present invention.
Figure 9:
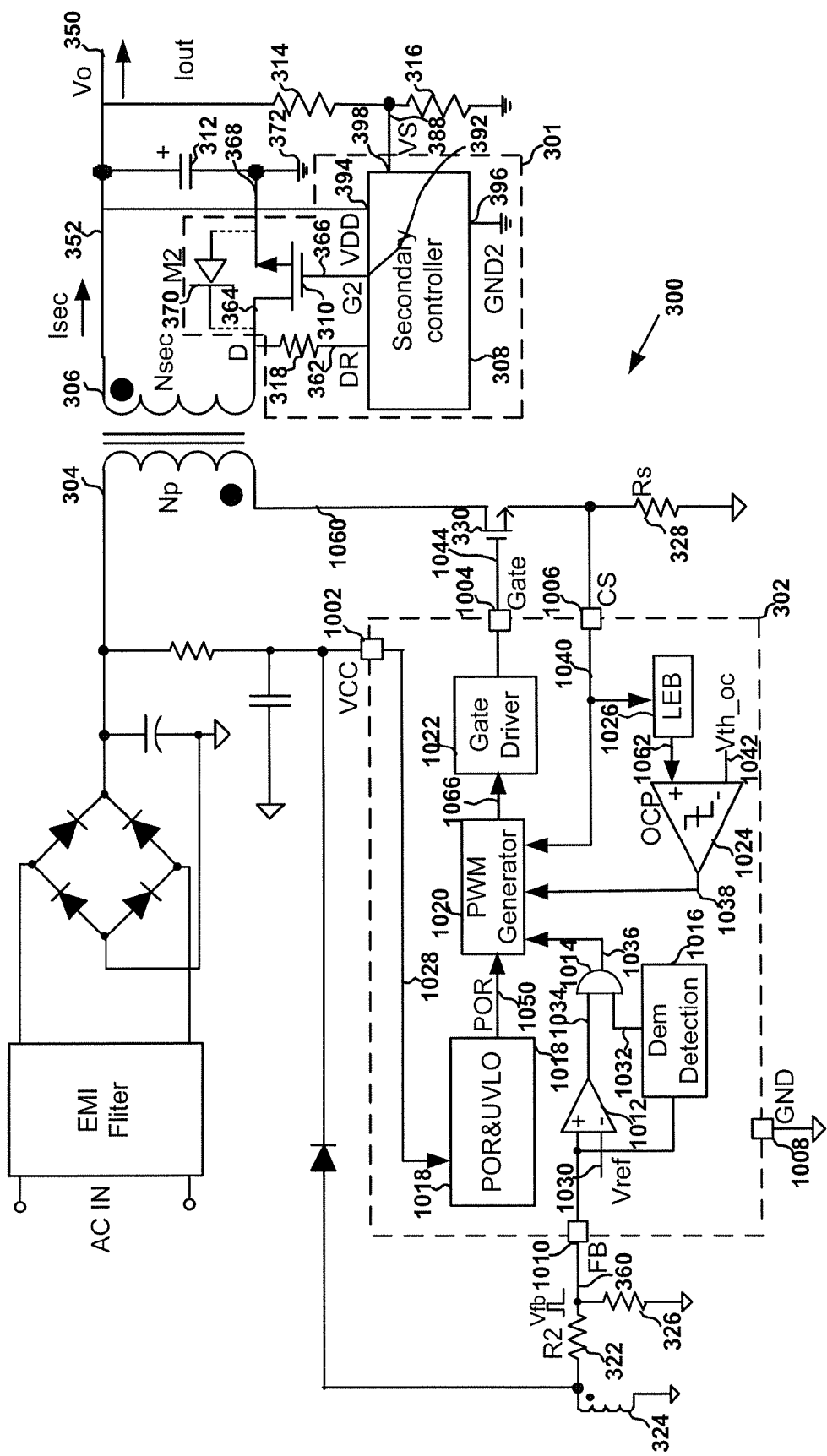

FIG. 9 is a simplified diagram showing certain components of a controller as part of a power conversion system as shown in FIG. 3(A) according to an embodiment of the present invention.

Figure 10:
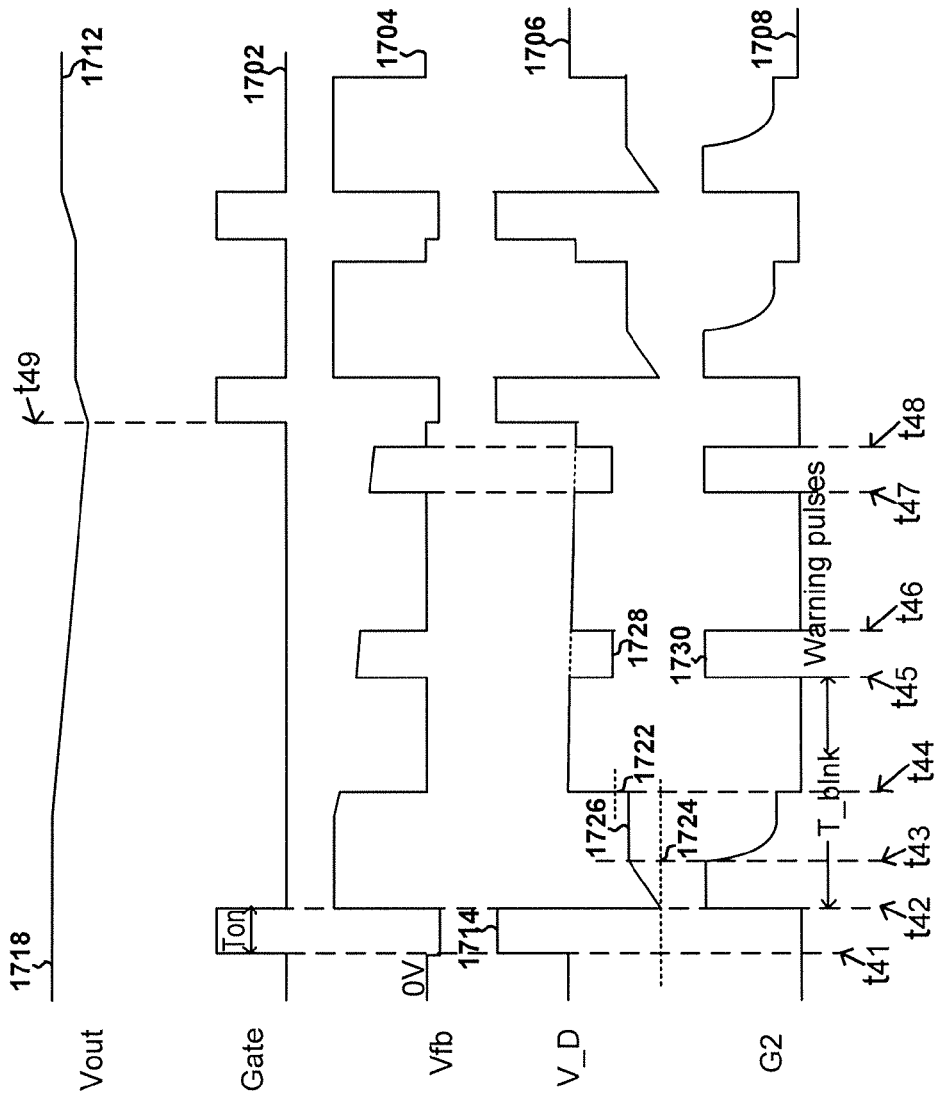

FIG. 10 is a simplified timing diagram for a power conversion system that includes a controller as shown in FIG. 9 and a secondary controller as shown in FIG. 7 and operates in the discontinuous conduction mode (DCM) according to an embodiment of the present invention.

5. DETAILED DESCRIPTION OF THE INVENTION

The present invention is directed to integrated circuits. More particularly, the invention provides systems and methods with output detection and synchronized rectifying mechanisms. Merely by way of example, the invention has been applied to a power conversion system. But it would be recognized that the invention has a much broader range of applicability.

FIG. 3(A) is a simplified diagram showing a power conversion system with a rectifying circuit according to an embodiment of the present invention. This diagram is merely an example, which should not unduly limit the scope of the claims. One of ordinary skill in the art would recognize many variations, alternatives, and modifications. The power conversion system 300 includes a controller 302, a primary winding 304, a secondary winding 306, an auxiliary winding 324, a rectifying circuit 301, a diode 320, a current sensing resistor 328, capacitors 312 and 380, resistors 314, 316, 322 and 326, and a power switch 330. The rectifying circuit 301 includes a secondary controller 308, a resistor 318 and a transistor 310. The secondary controller 308 includes terminals 390, 392, 394, 396 and 398. For example, the transistor 310 is a MOSFET. In another example, the power switch 330 is a transistor.

According to one embodiment, when the power switch 330 is closed (e.g., on), the energy is stored in the transformer that includes the primary winding 304 and the secondary winding 306. For example, when the power switch 330 is open (e.g., off), the stored energy is transferred to the secondary side, and the voltage of the auxiliary winding 324 maps an output voltage 350 on the secondary side. In another example, the controller 302 receives a feedback signal 360 from a voltage divider that includes the resistors 322 and 326 for output voltage regulation. In yet another example, during the process of energy transfer (e.g., a demagnetization process), the transistor 310 is turned on and at least part of a secondary current 352 flows through the transistor 310. In yet another example, a turn-on resistance of the transistor 310 is very small (e.g., in the range of tens of milli-ohms). In yet another example, the voltage drop on the transistor 310 when conducting is much smaller than a voltage drop on a rectifying diode (e.g., the diode 124 or the diode 260), and thus the power loss of the power conversion system 300 is greatly reduced compared with the system 100 or the system 200. In yet another example, the feedback signal 360 is related to the output voltage 350.

According to another embodiment, at the end of the energy transfer process (e.g., the demagnetization process), the secondary current 352 has a low value (e.g., nearly zero). For example, the transistor 310 is turned off to prevent a residual current flowing from an output terminal 351 to ground through the transistor 310. In another example, the power switch 330 remains off (e.g., open) when the transistor 310 is on. In yet another example, the secondary controller 308 receives a voltage signal 362 (e.g., $V_{DR}$) indicative of a voltage at a terminal 364 of the transistor 310 (e.g., a drain terminal of the transistor 310), and provides a signal 366 (e.g., at terminal G2) to drive the transistor 310.

As discussed above and further emphasized here, FIG. 3(A) is merely an example, which should not unduly limit the scope of the claims. One of ordinary skill in the art would recognize many variations, alternatives, and modifications. For example, the controller 302 and the secondary controller 308 are on different chips. In another example, the secondary controller 308 and the transistor 310 are on different chips which are part of a multi-chip package. In yet another example, the secondary controller 308 and the transistor 310 are integrated on a same chip.

Figure 3B:
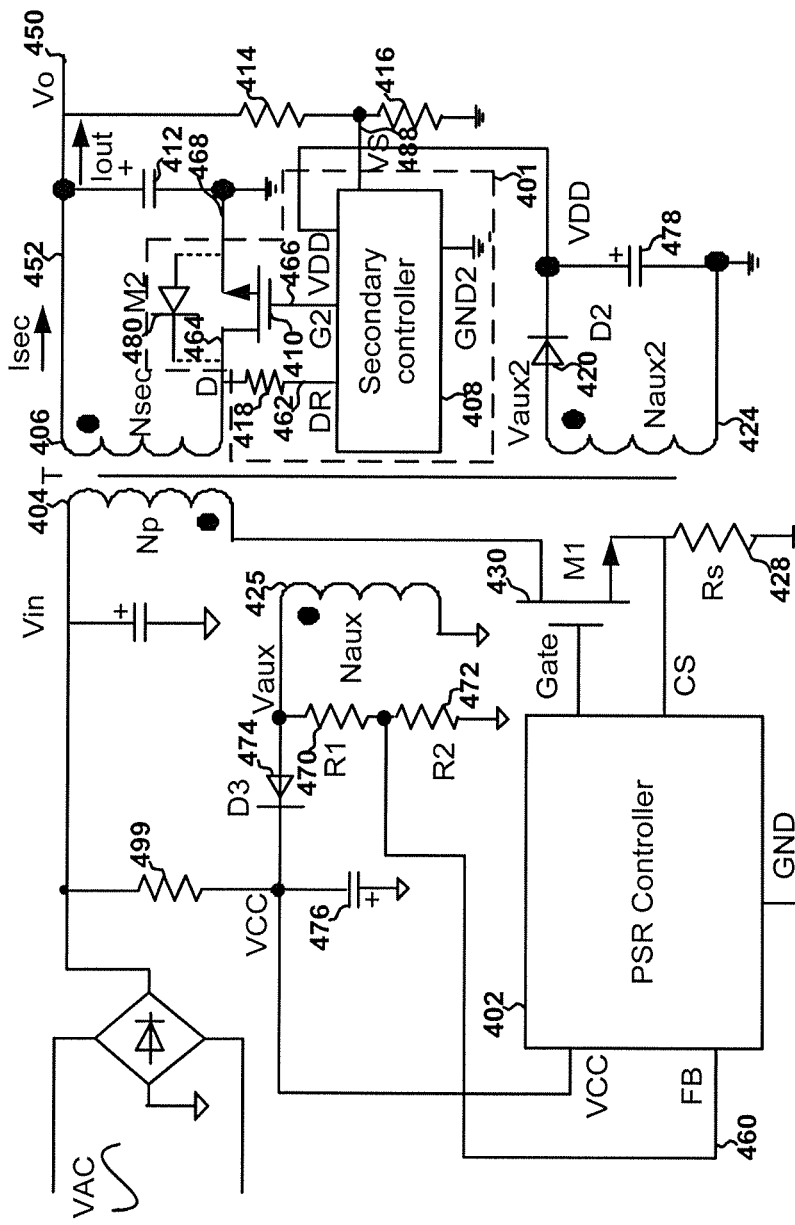
FIG. 3(B) is a simplified diagram showing a power conversion system with a rectifying circuit according to another embodiment of the present invention.

FIG. 3(B) is a simplified diagram showing a power conversion system with a rectifying circuit according to another embodiment of the present invention. This diagram is merely an example, which should not unduly limit the scope of the claims. One of ordinary skill in the art would recognize many variations, alternatives, and modifications. The power conversion system 400 includes a controller 402, a primary winding 404, a secondary winding 406, a first auxiliary winding 424, a second auxiliary winding 425, a rectifying circuit 401, diodes 420 and 474, capacitors 412, 476 and 478, a current sensing resistor 428, resistors 414, 416, 470 and 472, and a power switch 430. The rectifying circuit 401 includes a secondary controller 408, a resistor 418 and a transistor 410. For example, the transistor 410 is a MOSFET. In another example, the power switch 430 is a transistor. In yet another example, the rectifying circuit 401 is the same as the rectifying circuit 301.

According to one embodiment, when the power switch 430 is closed (e.g., on), the energy is stored in the transformer that includes the primary winding 404 and the secondary winding 406. For example, when the power switch 430 is open (e.g., off), the stored energy is transferred to the secondary side, and the voltage of the second auxiliary winding 425 maps an output voltage 450 on the secondary side. In another example, the controller 402 receives a feedback signal 460 from a voltage divider that includes the resistors 470 and 472 for output voltage regulation. In another example, during the process of energy transfer (e.g., a demagnetization process), the transistor 410 is turned on and at least part of a secondary current 452 flows through the transistor 410. In yet another example, a turn-on resistance of the transistor 410 is very small (e.g., in the range of tens of milli-ohms).

According to another embodiment, at the end of the energy transfer process (e.g., the demagnetization process), the secondary current 452 has a low value (e.g., nearly zero). For example, the transistor 410 is turned off to prevent a reversal current from flowing from an output terminal to ground through the transistor 410. In another example, the power switch 430 remains off (e.g., open) when the transistor 410 is on. In yet another example, the secondary controller 408 receives (e.g., at terminal DR) a voltage signal 462 indicative of a voltage at a terminal 464 of the transistor 410 (e.g., a drain terminal of the transistor 410), and provides a signal 466 (e.g., at terminal G2) to drive the transistor 410.

As discussed above and further emphasized here, FIG. 3(B) is merely an example, which should not unduly limit the scope of the claims. One of ordinary skill in the art would recognize many variations, alternatives, and modifications. For example, the controller 402 and the secondary controller 408 are on different chips. In another example, the secondary controller 408 and the transistor 410 are on different chips which are part of a multi-chip package. In yet another example, the secondary controller 408 and the transistor 410 are integrated on a same chip.

Figure 4:
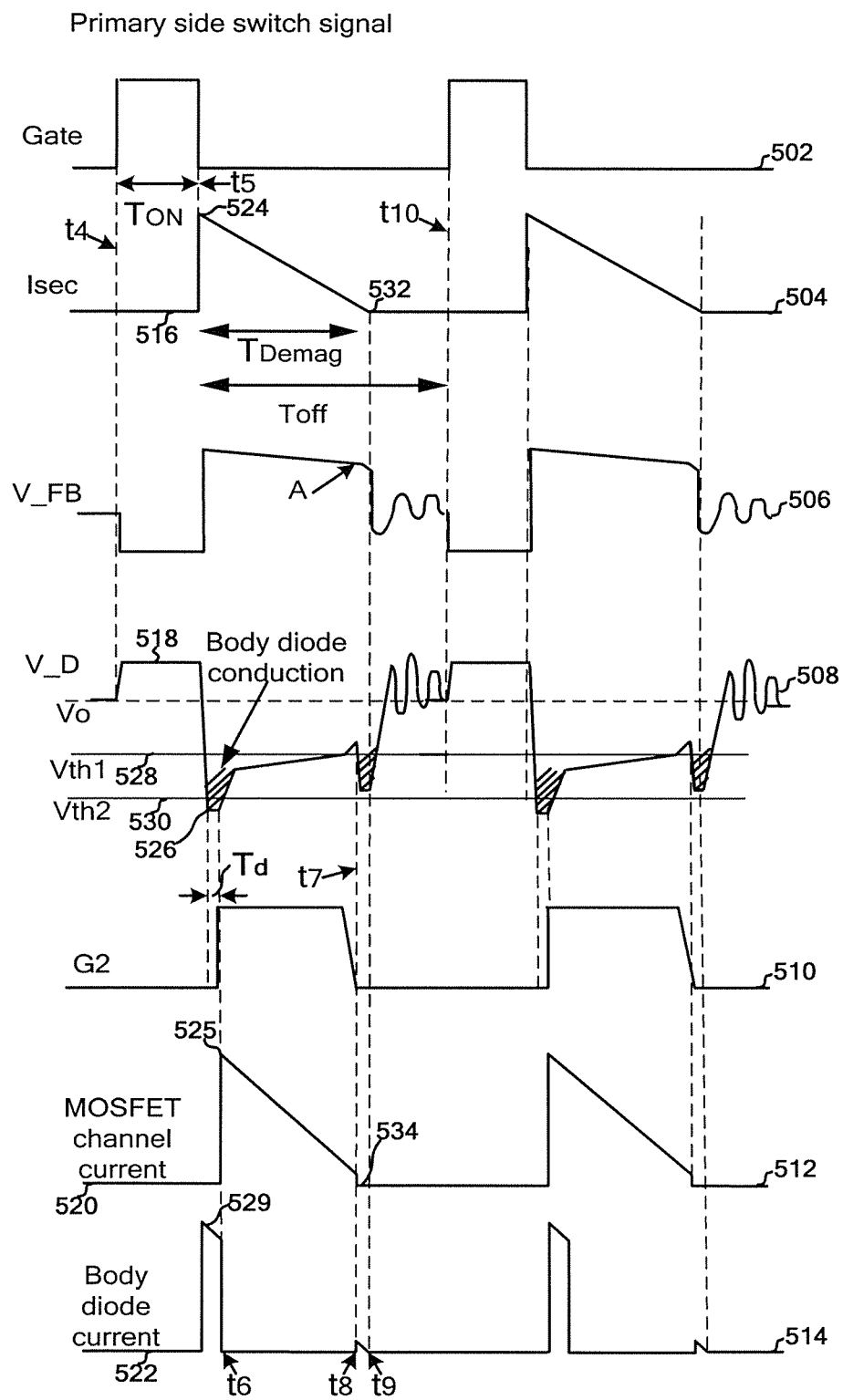
FIG. 4 is a simplified timing diagram for the power conversion system as shown in FIG. 3(A) operating in the discontinuous conduction mode (DCM) according to an embodiment of the present invention.

FIG. 4 is a simplified timing diagram for the power conversion system 300 as shown in FIG. 3(A) operating in the discontinuous conduction mode (DCM) according to an embodiment of the present invention. This diagram is merely an example, which should not unduly limit the scope of the claims. One of ordinary skill in the art would recognize many variations, alternatives, and modifications. For example, the waveform 502 represents the power switch 330 being turned on or off as a function of time, the waveform 504 represents the secondary current 352 as a function of time, and the waveform 506 represents the feedback signal 360 as a function of time. In addition, the waveform 508 represents the voltage signal 362 (e.g., at terminal DR) as a function of time, the waveform 510 represents the signal 366 (e.g., at terminal G2) as a function of time, the waveform 512 represents a channel current 368 that flows through the transistor 310 as a function of time, and the waveform 514 represents a body-diode current 370 that flows through a body diode of the transistor 310 (e.g., a parasitic diode) as a function of time.

For example, a switching period of the switch 330 includes an on-time period during which the switch 330 is closed (e.g., on) and an off-time period during which the switch 330 is open (e.g., off). In another example, as shown in FIG. 4, an on-time period of the switch 330 (e.g., $T_{on}$) starts at time $t_4$ and ends at time $t_5$, and an off-time period of the switch 330 (e.g., $T_{off}$) starts at the time $t_5$ and ends at time $t_9$. A demagnetization period associated with the transformer including the primary winding 304 and the secondary winding 306 (e.g., $T_{demag}$) starts at the time $t_5$ and ends at time $t_8$. In yet another example, $t_4 \leq t_5 \leq t_6 \leq t_7 \leq t_8 \leq t_9$.

According to one embodiment, during the on-time period (e.g., $T_{on}$), the switch 330 is closed (e.g., being turned on) as shown by the waveform 502, and the energy is stored in the transformer that includes the primary winding 304 and the secondary winding 306. For example, the secondary current 352 has a low value 516 (e.g., nearly zero) as shown by the waveform 504. In another example, the voltage signal 362 (e.g., $V_{DR}$) received by the secondary controller 308 has a value 518 which is higher than zero (e.g., as shown by the waveform 508). In yet another example, the signal 366 is at a logic low level (e.g., as shown by the waveform 510), and the transistor 310 is off. In yet another example, during the on-time period (e.g., $T_{on}$), the channel current 368 has a low value 520 (e.g., nearly zero as shown by the waveform 512) and the body-diode current 370 has a low value 522 (e.g., nearly zero as shown by the waveform 514).

According to another embodiment, at the end of the on-time period (e.g., at $t_5$), the switch 330 is open (e.g., off) as shown by the waveform 502, and the energy is transferred to the secondary side. For example, the secondary current 352 increases from the value 516 to a value 524 (e.g., at $t_s$) as shown by the waveform 504. In another example, the voltage signal 362 (e.g., $V_{DR}$) decreases from the value 518 to a value 526 (e.g., as shown by the waveform 508). In yet another example, the value 526 is lower than both a first threshold voltage 528 (e.g., $V_{th1}$) and a second threshold voltage 530 (e.g., $V_{th2}$). In yet another example, both the first threshold voltage 528 (e.g., $V_{th1}$) and the second threshold voltage 530 (e.g., $V_{th2}$) are lower than a ground voltage 372 (e.g., zero volt). In yet another example, the body diode of the transistor 310 begins to conduct, and the body-diode current 370 increases from the value 522 to a value 529 (e.g., as shown by the waveform 514). Thereafter, the signal 366 changes from the logic low level to a logic high level (e.g., at $t_6$ as shown by the waveform 510) and the transistor 310 is turned on in certain embodiments. For example, the channel current 368 increases from the value 520 to a value 525 (e.g., at $t_6$ as shown by the waveform 512). In another example, there is a delay (e.g., $T_d$) between the time at which the voltage signal 362 (e.g., $V_{DR}$) decreases from the value 518 to a value 526 and the time at which the signal 366 changes from the logic low level to the logic high level. In yet another example, the delay (e.g., $T_d$) is zero.

According to yet another embodiment, during the demagnetization period (e.g., $T_{demag}$), the switch 330 remains open (e.g., off) as shown by the waveform 502. For example, the secondary current 352 decreases from the value 524 as shown by the waveform 504. In another example, if the voltage signal 362 (e.g., $V_{DR}$) is larger than the first threshold voltage 528 (e.g., at $t_7$ as shown by the waveform 508), the signal 366 changes from the logic high level to the logic low level (e.g., as shown by the waveform 510). In yet another example, the voltage signal 362 (e.g., $V_{DR}$) decreases to become lower than the first threshold voltage 528 again (e.g., at $t_8$ as shown by the waveform 508). In yet another example, the transistor 310 is turned off, and the channel current 368 decreases to a low value 534 (e.g., nearly zero as shown by the waveform 512). In yet another example, the body-diode current 370 flows through the body diode of the transistor 310, and decreases to a low value (e.g., nearly zero at $t_9$ as shown by the waveform 514). In yet another example, the demagnetization period ends at the time $t_9$. In yet another example, immediately after the time $t_9$, the voltage signal 362 increases as shown by a rising edge in the waveform 508, and such a rising edge, even if detected, is not used for determining the switching frequency of the power conversion system 300 (e.g., the load conditions). In yet another example, the secondary current 352 is equal to a sum of the channel current 368 and the body-diode current 370. Thus, a combination of part of the waveform 512 (e.g., between $t_5$ and $t_9$) and part of the waveform 514 (e.g., between $t_5$ and $t_9$) is equal to part of the waveform 504 (e.g., between $t_5$ and $t_9$) in certain embodiments.

According to yet another embodiment of the present invention, FIG. 4 is a simplified timing diagram for the power conversion system 400 shown in FIG. 3(B) operating in the discontinuous conduction mode (DCM). For example, the waveform 502 represents the power switch 430 being turned on or off as a function of time, the waveform 504 represents the secondary current 452 as a function of time, and the waveform 506 represents the feedback signal 460 as a function of time. In addition, the waveform 508 represents the voltage signal 462 (e.g., at terminal DR) as a function of time, the waveform 510 represents the signal 466 (e.g., at terminal G2) as a function of time, the waveform 512 represents a channel current 468 that flows through the transistor 410 as a function of time, and the waveform 514 represents a body-diode current 480 that flows through a body diode of the transistor 410 (e.g., a parasitic diode) as a function of time.

As discussed above and further emphasized here, FIG. 4 is merely an example, which should not unduly limit the scope of the claims. One of ordinary skill in the art would recognize many variations, alternatives, and modifications. For example, the power conversion system 300 shown in FIG. 3(A) or the power conversion system 400 shown in FIG. 3(B) operating in other modes, such as a continuous conduction mode and the critical conduction mode (e.g., the quasi-resonant mode), can also implement the scheme as illustrated in FIG. 4.

In certain embodiments, the scheme as illustrated in FIG. 4 is implemented in the continuous conduction mode. For example, if the secondary controller 308 detects a falling edge of the signal 362 (e.g., $V_{DR}$), the secondary controller 308 changes the signal 366 to turn on the transistor 310. In another example, the controller 302 turns on the transistor 330 before the demagnetization period ends (e.g., the secondary current 352 being larger than zero), and in response the signal 362 (e.g., $V_{DR}$) increases. In yet another example, the secondary controller 308 detects a rising edge of the signal 362 and changes the signal 366 to turn off the transistor 310.

Figure 5:
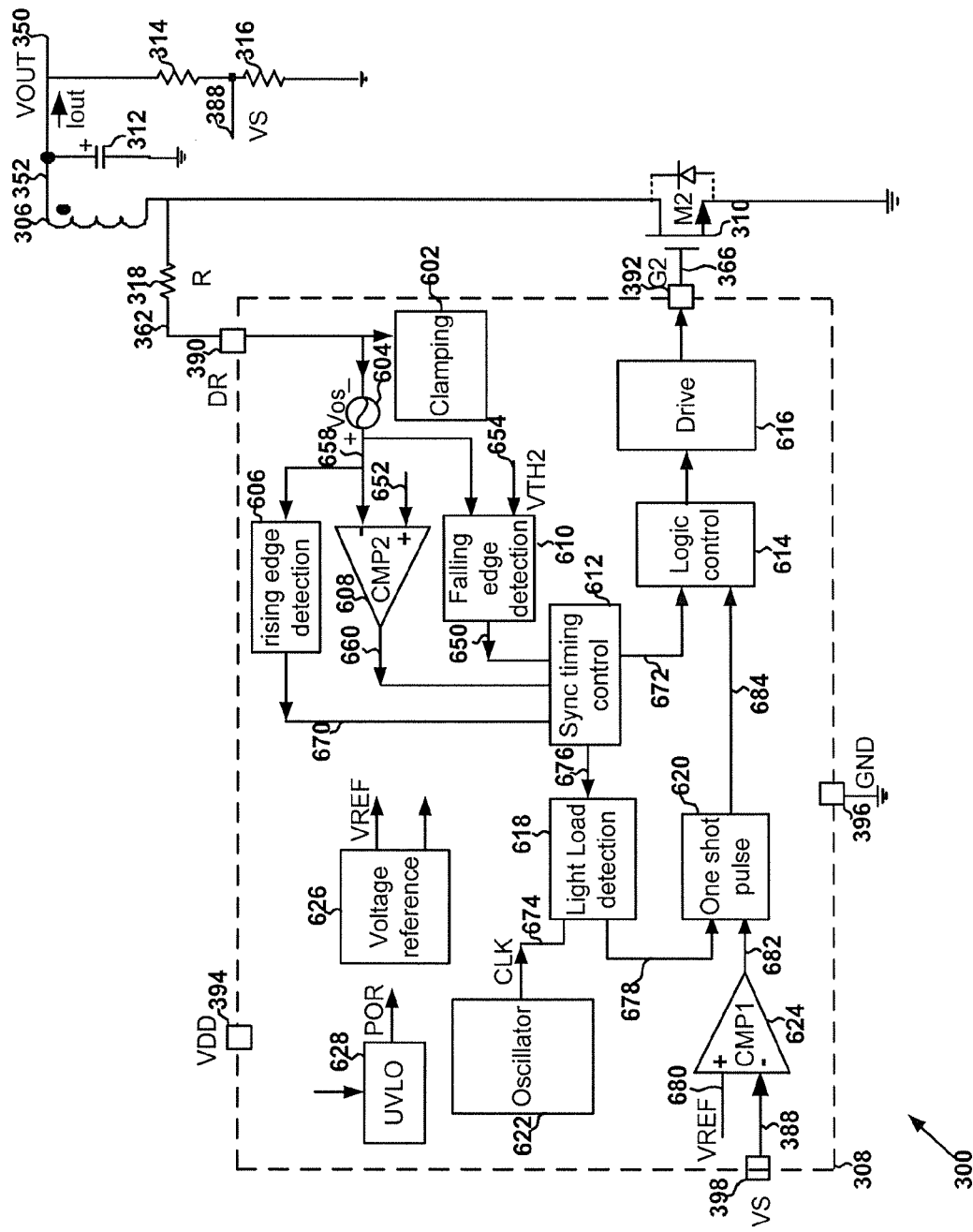
FIG. 5 is a simplified diagram showing certain components of the secondary controller as part of the power conversion system as shown in FIG. 3(A) according to an embodiment of the present invention.

FIG. 5 is a simplified diagram showing certain components of the secondary controller 308 as part of the power conversion system 300 according to an embodiment of the present invention. This diagram is merely an example, which should not unduly limit the scope of the claims. One of ordinary skill in the art would recognize many variations, alternatives, and modifications. The secondary controller 308 includes a clamping component 602, an offset component 604, a rising-edge detection component 606, comparators 608 and 624, a falling-edge detection component 610, a timing controller 612, a logic control component 614, a gate driver 616, a light-load detector 618, a signal generator 620, an oscillator 622, an under-voltage-lockout component 628, and a reference-signal generator 626. For example, some components of the secondary controller 308 are used for synchronized rectifying, including the clamping component 602, the offset component 604, the rising-edge detection component 606, the comparator 608, the falling-edge detection component 610, the timing controller 612, the logic control component 614, and the gate driver 616. In another example, certain components of the secondary controller 308 are used for output voltage detection and control, including the light-load detector 618, the signal generator 620, the oscillator 622, the reference-signal generator 626, the logic control component 614, and the gate driver 616. In yet another example, the components of the secondary controller 308 that are used for synchronized rectifying and the components of the secondary controller 308 that are used for output voltage detection and control are integrated on a same chip.

Figure 6:
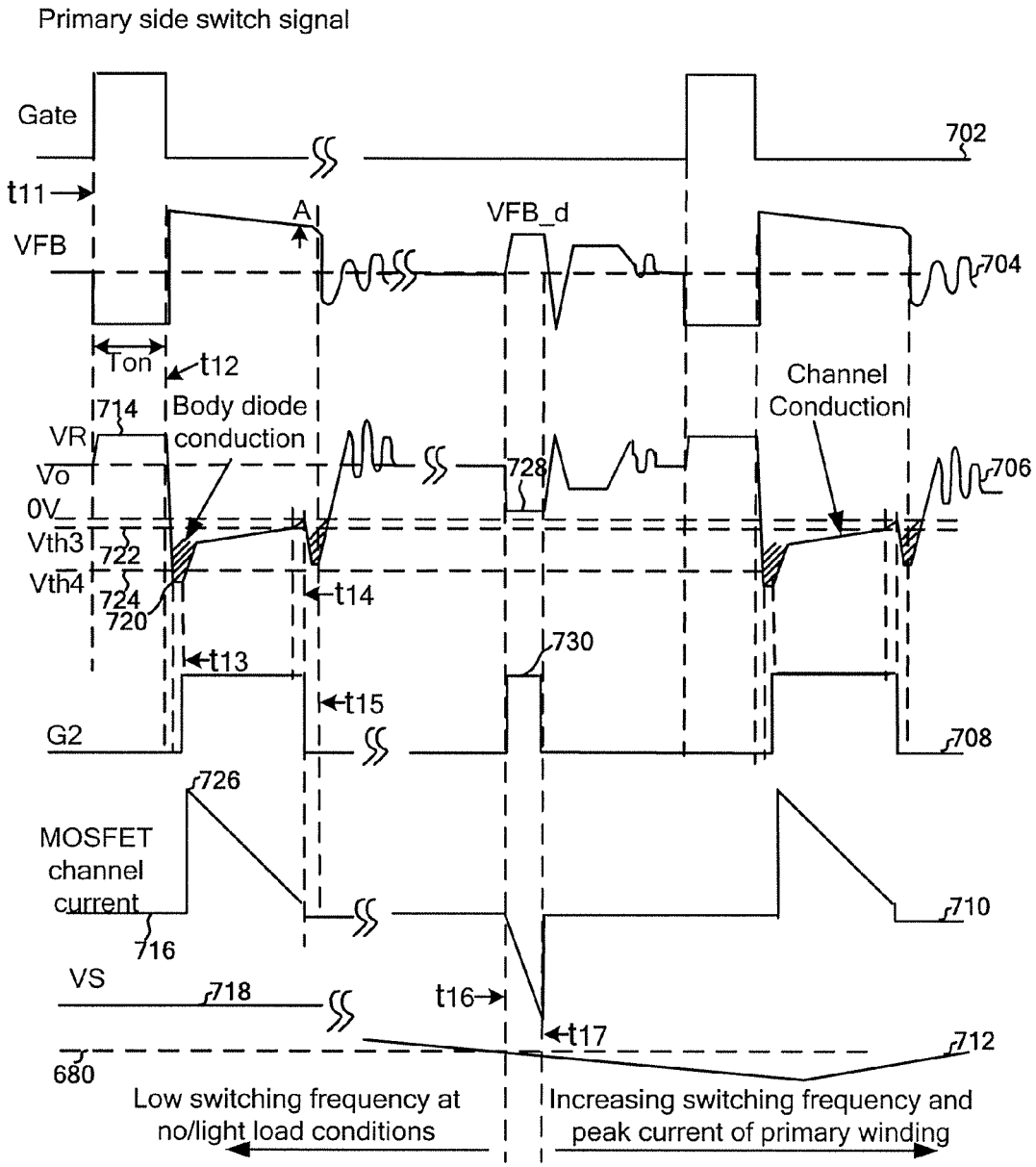
FIG. 6 is a simplified timing diagram for the power conversion system as shown in FIG. 3(A) that includes the secondary controller as shown in FIG. 5 and operates in the discontinuous conduction mode (DCM) according to an embodiment of the present invention.

FIG. 6 is a simplified timing diagram for the power conversion system 300 that includes the secondary controller 308 as shown in FIG. 5 and operates in the discontinuous conduction mode (DCM) according to an embodiment of the present invention. This diagram is merely an example, which should not unduly limit the scope of the claims. One of ordinary skill in the art would recognize many variations, alternatives, and modifications. For example, the waveform 702 represents the power switch 330 being turned on or off as a function of time, the waveform 704 represents the feedback signal 360 as a function of time, and the waveform 706 represents the voltage signal 362 (e.g., at terminal 390) as a function of time. In addition, the waveform 708 represents the signal 366 (e.g., at terminal 392) as a function of time, the waveform 710 represents a channel current 368 that flows through the transistor 310 as a function of time, and the waveform 712 represents a voltage signal 388 (e.g., at terminal 398) that indicates the output voltage 350 as a function of time.

According to one embodiment, the clamping component 602 receives the voltage signal 362 (e.g., $V_{DR}$) from the terminal 390 (e.g., terminal DR). For example, the rising-edge-detection component 606, the comparator 608 and the falling-edge-detection component 610 receive a signal 658 which is equal to the voltage signal 362 modified by the offset component 604. In another example, the rising-edge-detection component 606, the comparator 608 and the falling-edge-detection component 610 output signals 670, 660 and 650 respectively based on at least information associated with the signal 658. In yet another example, the timing controller 612 receives the signals 670, 660 and 650 and outputs a signal 672 to the logic controller 614 in order to drive the transistor 310. The offset component 604 is omitted in some embodiments.

According to another embodiment, before time $t_{16}$, the power conversion system 300 is under no/light load conditions and the switching frequency of the system 300 is kept low (e.g., lower than a threshold). For example, during an on-time period (e.g., between time $t_{11}$ and time $t_{12}$), the switch 330 is closed (e.g., being turned on) as shown by the waveform 702, and the energy is stored in the transformer that includes the primary winding 304 and the secondary winding 306. In another example, the voltage signal 362 (e.g., at terminal DR) has a value 714 (e.g., as shown by the waveform 706), and is clamped by the clamping component 602. In yet another example, the signal 366 (e.g., at terminal G2) is at a logic low level (e.g., as shown by the waveform 708), and the transistor 310 is off. In yet another example, during the on-time period (e.g., $T_{on}$), the channel current 368 has a low value 716 (e.g., nearly zero as shown by the waveform 710). In yet another example, the voltage signal 388 (e.g., $V_s$) has a value 718 (e.g., as shown by the waveform 712).

According to yet another embodiment, at the end of the on-time period (e.g., at $t_{12}$), the switch 330 is open (e.g., off) as shown by the waveform 702, and the energy is transferred to the secondary side. For example, the voltage signal 362 decreases from the value 714 to a value 720 (e.g., as shown by the waveform 706). In yet another example, the value 720 is lower than both a third threshold voltage 722 (e.g., $V_{th3}$) and a fourth threshold voltage 724 (e.g., $V_{th4}$). In yet another example, both the third threshold voltage 722 (e.g., $V_{th3}$) and the fourth threshold voltage 724 (e.g., $V_{th4}$) are lower than a ground voltage 372. In yet another example, the body diode of the transistor 310 begins to conduct, and the body-diode current 370 increases in magnitude. Thereafter, the signal 366 changes from the logic low level to a logic high level (e.g., at $t_{13}$ as shown by the waveform 708), and the transistor 310 is turned on in certain embodiments. For example, the third threshold voltage 722 (e.g., $V_{th3}$) and the fourth threshold voltage 724 (e.g., $V_{th4}$) are the same as the first threshold voltage 528 and the second threshold voltage 530, respectively.

According to yet another embodiment, when the voltage signal 362 decreases from the value 714 to the value 720 (e.g., as shown by the waveform 706), the falling-edge detection component 610 detects the drop of the voltage signal 362 and changes the signal 650 in order to turn on the transistor 310. For example, in response, the channel current 368 increases from the value 716 to a value 726 (e.g., at $t_{13}$ as shown by the waveform 710). In another example, a voltage drop between the drain terminal and the source terminal of the transistor 310 is determined based on the following equation:

$$V_{DS\_M2} = -I_{sec} \times R_{ds\_on} \qquad \text{(Equation 1)}$$

where $V_{DS\_M2}$ represents the voltage drop between the drain terminal and the source terminal of the transistor 310, $I_{sec}$ represents the secondary current 352, and $R_{ds\_on}$ represents a turn-on resistance of the transistor 310.

Because the turn-on resistance of the transistor 310 is very small, the magnitude of the voltage drop between the drain terminal and the source terminal of the transistor 310 is much smaller than a forward voltage of a rectifying diode (e.g., the diode 124 or the diode 260), according to certain embodiments. For example, when the secondary current 352 becomes very small (e.g., approximately zero), the voltage drop between the drain terminal and the source terminal of the transistor 310 becomes very small in magnitude, and the voltage signal 362 is very small in magnitude. In another example, if the signal 658 is larger than the reference signal 652 in magnitude, the comparator 608 changes the signal 660 in order to turn off the transistor 310. In yet another example, the signal 366 changes from the logic high level to the logic low level (e.g., at $t_{14}$ as shown by the waveform 708) and the transistor 310 is turned off. In yet another example, the body diode of the transistor 310 begins to conduct again, and the body-diode current 370 decreases in magnitude (e.g., eventually to nearly zero at $t_{15}$). Thus, the energy is completely delivered to the output in some embodiments.

In one embodiment, the secondary controller 308 continuously monitors the output voltage 350 through the signal 388 (e.g., $V_s$). For example, the comparator 624 receives a reference signal 680 and the signal 388 (e.g., $V_s$) and outputs a signal 682. In another example, the light-load detector 618 receives a clock signal from the oscillator 622 and a signal 676 from the timing controller 612. In yet another example, the signal 676 indicates certain switching events (e.g., rising edges or falling edges) in the signal 362. In yet another example, the light-load detector 618 outputs a signal 678 which indicates the switching frequency of the power conversion system 300. In yet another example, the signal generator 620 receives the signal 678 and the signal 682 and outputs a signal 684 to the logic control component 614 in order to affect the status of the transistor 310.

In another embodiment, if the output voltage 350 drops below a threshold level in any conditions, for example, when the output load conditions changes from no/light load conditions to full load conditions (e.g., between $t_{16}$ and $t_{17}$), the output voltage 350 decreases (e.g., below a threshold level). For example, if the signal 388 (e.g., $V_s$) changes from a first value larger than the reference signal 680 in magnitude to a second value lower than the reference signal 680 in magnitude (e.g., at $t_{16}$ as shown by the waveform 712), the comparator 624 generates a pulse in the signal 682 in order to turn on the transistor 310 during a short time period. In some embodiments, if the signal 678 indicates that the power conversion system 300 is under no/light load conditions, the signal generator 620 outputs a pulse in the signal 684, and in response the gate driver 616 generates a pulse 730 in the signal 366 (e.g., as shown by the waveform 708). For example, the signal 362 (e.g., at terminal DR) decreases to a value 728 (e.g., between $t_{16}$ and $t_{17}$ as shown by the waveform 706). In yet another example, the transistor 310 is turned on during a pulse period associated with the pulse 730 in the signal 366, and the channel current 368 flows in a different direction (e.g., from the output capacitor 312 through the transistor 310 to ground) as shown by the waveform 710. In yet another example, the feedback signal 360 increases in magnitude, and forms a pulse (e.g., between $t_{16}$ and $t_{17}$ as shown by the waveform 704). The controller 302 detects the pulse of the feedback signal 360 and, in response, increases the peak current of the primary winding 304 and the switching frequency in order to deliver more energy to the secondary side according to certain embodiments. For example, the output voltage 350 and the voltage signal 388 increase in magnitude eventually (e.g., at $t_{18}$ as shown by the waveform 712).

As discussed above and further emphasized here, FIG. 5 and FIG. 6 are merely examples, which should not unduly limit the scope of the claims. One of ordinary skill in the art would recognize many variations, alternatives, and modifications. For example, the secondary controller 408 is the same as the secondary controller 308 as shown in FIG. 5.

In certain embodiments, FIG. 6 is a simplified timing diagram for the power conversion system 400 that includes the secondary controller 408 and operates in the discontinuous conduction mode (DCM). For example, the waveform 702 represents the power switch 430 being turned on or off as a function of time, the waveform 704 represents the feedback signal 460 as a function of time, and the waveform 706 represents the voltage signal 462 as a function of time. In addition, the waveform 708 represents the signal 466 as a function of time, the waveform 710 represents a channel current 468 that flows through the transistor 410 as a function of time, and the waveform 712 represents a voltage signal 488 that indicates the output voltage 450 as a function of time.

In some embodiments, the secondary controller 308 as part of the power conversion system 300 or the secondary controller 408 as part of the power conversion system 400 operating in other modes, such as a continuous conduction mode and the critical conduction mode (e.g., the quasi-resonant mode), can also implement the scheme as illustrated in FIG. 5 and FIG. 6.

According to another embodiment, a system controller for regulating a power conversion system includes a first controller terminal and a second controller terminal. The system controller is configured to receive at least an input signal at the first controller terminal, and generate a gate drive signal at the second controller terminal based on at least information associated with the input signal to turn on or off a transistor in order to affect a current associated with a secondary winding of the power conversion system. The system controller is further configured to, if the input signal is larger than a first threshold, generate the gate drive signal at a first logic level to turn off the transistor, and if the input signal changes from a first value larger than a second threshold to a second value smaller than the second threshold, change the gate drive signal from the first logic level to a second logic level to turn on the transistor. For example, the system is implemented according to FIG. 3(A), FIG. 3(B), FIG. 4, FIG. 5, and/or FIG. 6.

According to another embodiment, a system controller for regulating a power conversion system includes a first controller terminal and a second controller terminal. The system controller is configured to receive at least an input signal at the first controller terminal, the input signal being proportional to an output voltage associated with a secondary winding of the power conversion system, and generate a gate drive signal at the second controller terminal based on at least information associated with the input signal to turn on or off a transistor in order to affect a current associated with the secondary winding of the power conversion system. The system controller is further configured to, only if the input signal changes from a first value larger than a first threshold to a second value smaller than the first threshold, generate a pulse of the gate drive signal to turn on the transistor during a pulse period associated with the pulse. For example, the system is implemented according to at least FIG. 3(A), FIG. 3(B), FIG. 5, and/or FIG. 6.

According to yet another embodiment, a system controller for regulating a power conversion system includes a first comparator, a signal detector, and a driving component. The first comparator is configured to receive an input signal and output a first comparison signal based on at least information associated with the input signal. The signal detector is configured to receive the input signal and output a first detection signal based on at least information associated with the input signal. The driving component is configured to output a gate drive signal based on at least information associated with the first comparison signal and the first detection signal to turn on or off a transistor in order to affect a current associated with a secondary winding of the power conversion system. The comparator is further configured to determine whether the input signal is larger than a first threshold. The signal detector is further configured to determine whether the input signal changes from a first value larger than a second threshold to a second value smaller than the second threshold. The driving component is further configured to, if the first comparison signal indicates the input signal is larger than the first threshold, generate the gate drive signal at a first logic level to turn off the transistor, and if the first detection signal indicates the input signal changes from the first value larger than the second threshold to the second value smaller than the second threshold, change the gate drive signal from the first logic level to a second logic level to turn on the transistor. For example, the system is implemented according to FIG. 3(A), FIG. 3(B), FIG. 4, FIG. 5, and/or FIG. 6.

In one embodiment, a system controller for regulating a power conversion system includes a comparator, a pulse signal generator, and a driving component. A comparator is configured to receive an input signal and output a comparison signal based on at least information associated with the input signal. The pulse signal generator is configured to receive at least the comparison signal and generate a pulse signal based on at least information associated with the comparison signal. The driving component is configured to receive the pulse signal and generate a gate drive signal based on at least information associated with the pulse signal to turn on or off a transistor in order to affect a current associated with the secondary winding of the power conversion system. The comparator is further configured to determine whether the input signal is larger than or smaller than a threshold. The pulse signal generator is further configured to, only if the comparison signal indicates the input signal changes from a first value larger than the threshold to a second value smaller than the threshold, generate a first pulse of the pulse signal. The driving component is further configured to, in response to the first pulse of the pulse signal, generate a second pulse of the gate drive signal to turn on the transistor during a pulse period associated with the second pulse. For example, the system is implemented according to at least FIG. 3(A), FIG. 3(B), FIG. 5, and/or FIG. 6.

In another embodiment, a method for regulating a power conversion system includes receiving at least an input signal, processing information associated with the input signal, and generating a gate drive signal based on at least information associated with the input signal to turn on or off a transistor in order to affect a current associated with a secondary winding of the power conversion system. The process for generating a gate drive signal based on at least information associated with the input signal to turn on or off a transistor in order to affect a current associated with a secondary winding of the power conversion system includes, if the input signal is larger than a first threshold, generating the gate drive signal at a first logic level to turn off the transistor, and if the input signal changes from a first value larger than a second threshold to a second value smaller than the second threshold, changing the gate drive signal from the first logic level to a second logic level to turn on the transistor. For example, the method is implemented according to FIG. 3(A), FIG. 3(B), FIG. 4, FIG. 5, and/or FIG. 6.

In yet another embodiment, a method for regulating a power conversion system includes receiving at least an input signal, the input signal being proportional to an output voltage associated with a secondary winding of the power conversion system, processing information associated with the input signal, and generating a gate drive signal based on at least information associated with the input signal to turn on or off a transistor in order to affect a current associated with the secondary winding of the power conversion system. The process for generating a gate drive signal based on at least information associated with the input signal to turn on or off a transistor in order to affect a current associated with the secondary winding of the power conversion system includes, only if the input signal changes from a first value larger than a first threshold to a second value smaller than the first threshold, generating a pulse of the gate drive signal to turn on the transistor during a pulse period associated with the pulse. For example, the method is implemented according to at least FIG. 3(A), FIG. 3(B), FIG. 5, and/or FIG. 6.

In yet another embodiment, a method for regulating a power conversion system includes receiving an input signal, processing information associated with the input signal, and determining whether the input signal is larger than a first threshold. The method further includes generating a comparison signal based on at least information associated with the input signal, determining whether the input signal changes from a first value larger than a second threshold to a second value smaller than the second threshold, and generating a detection signal based on at least information associated with the input signal. In addition, the method includes outputting a gate drive signal based on at least information associated with the comparison signal and the detection signal to turn on or off a transistor in order to affect a current associated with a secondary winding of the power conversion system. The process for outputting a gate drive signal based on at least information associated with the comparison signal and the detection signal to turn on or off a transistor in order to affect a current associated with a secondary winding of the power conversion system includes, if the comparison signal indicates the input signal is larger than the first threshold, generating the gate drive signal at a first logic level to turn off the transistor, and if the detection signal indicates the input signal changes from the first value larger than the second threshold to the second value smaller than the second threshold, changing the gate drive signal from the first logic level to a second logic level to turn on the transistor. For example, the method is implemented according to FIG. 3(A), FIG. 3(B), FIG. 4, FIG. 5, and/or FIG. 6.

In yet another embodiment, a method for regulating a power conversion system includes receiving an input signal, processing information associated with the input signal, and determining whether the input signal is larger than or smaller than a threshold. The method further includes generating a comparison signal based on at least information associated with the first input signal, receiving the comparison signal, and processing information associated with the comparison signal. In addition, the method includes generating a pulse signal based on at least information associated with the comparison signal, receiving the pulse signal, processing information associated with the pulse signal, and generating a gate drive signal based on at least information associated with the pulse signal to turn on or off a transistor in order to affect a current associated with the secondary winding of the power conversion system. The process for generating a pulse signal based on at least information associated with the comparison signal includes, only if the comparison signal indicates the input signal changes from a first value larger than the threshold to a second value smaller than the threshold, generating a first pulse of the pulse signal. The process for generating a gate drive signal based on at least information associated with the pulse signal to turn on or off a transistor in order to affect a current associated with the secondary winding of the power conversion system includes, in response to the first pulse of the pulse signal, generate a second pulse of the gate drive signal to turn on the transistor during a pulse period associated with the second pulse. For example, the method is implemented according to at least FIG. 3(A), FIG. 3(B), FIG. 5, and/or FIG. 6.

As discussed above and further emphasized here, FIG. 3(A), FIG. 3(B), FIG. 4 are merely examples, which should not unduly limit the scope of the claims. One of ordinary skill in the art would recognize many variations, alternatives, and modifications. For example, the resistor 318 is removed. In another example, the resistor 418 is removed. In yet another example, the first threshold voltage 528 (e.g., $V_{th1}$) is equal to −10 mV, and the second threshold voltage 530 (e.g., $V_{th2}$) is equal to −300 mV.

FIG. 7 is a simplified diagram showing certain components of the secondary controller 308 as part of the power conversion system 300 according to another embodiment of the present invention. This diagram is merely an example, which should not unduly limit the scope of the claims. One of ordinary skill in the art would recognize many variations, alternatives, and modifications. The secondary controller 308 includes a clamping component 802, an offset component 804, a rising-edge detection component 806, a soft-off regulator 808, a comparator 824, a falling-edge detection component 810, a timing controller 812, a logic control component 814, a driving component 816, a light-load detector 818, a signal generator 820, an oscillator 822, an under-voltage-lockout component 828, a reference-signal generator 826, a transistor 898, and a current source 896.

According to one embodiment, some components of the secondary controller 308 are used for synchronized rectifying, including the clamping component 802, the offset component 804, the rising-edge detection component 806, the soft-off regulator 808, the falling-edge detection component 810, the timing controller 812, the logic control component 814, the driving component 816, the transistor 898 and the current source 896. For example, certain components of the secondary controller 308 are used for output voltage detection and control, including the light-load detector 818, the signal generator 820, the oscillator 822, the reference-signal generator 826, the logic control component 814, and the driving component 816. In another example, the components of the secondary controller 308 that are used for synchronized rectifying and the components of the secondary controller 308 that are used for output voltage detection and control are integrated on a same chip. In yet another example, the clamping component 802, the offset component 804, the rising-edge detection component 806, the comparator 824, the falling-edge detection component 810, the timing controller 812, the logic control component 814, the driving component 816, the light-load detector 818, the signal generator 820, the oscillator 822, the under-voltage-lockout component 828, and the reference-signal generator 826 are the same as the clamping component 602, the offset component 604, the rising-edge detection component 606, the comparator 624, the falling-edge detection component 610, the timing controller 612, the logic control component 614, the gate driver 616, the light-load detector 618, the signal generator 620, the oscillator 622, the under-voltage-lockout component 628, and the reference-signal generator 626, respectively. In yet another example, the rising-edge detection component 806 includes a comparator, and the falling-edge detection component 810 includes another comparator.

According to another embodiment, the clamping component 802 receives the voltage signal 362 (e.g., $V_{DR}$) from the terminal 390 (e.g., terminal DR). For example, the rising-edge-detection component 806, the soft-off regulator 808 and the falling-edge detection component 810 receive a signal 858 which is equal to the voltage signal 362 modified by the offset component 804. In another example, the rising-edge-detection component 806 also receives a first threshold voltage 892 and outputs a signal 870 based on at least information associated with the signal 858 and the first threshold voltage 892. In yet another example, the falling-edge-detection component 810 also receives a second threshold voltage 854 and outputs a signal 850 based on at least information associated with the signal 858 and the second threshold voltage 854. In yet another example, the soft-off regulator 808 also receives a third threshold voltage 890 and outputs a signal 860 based on at least information associated with the signal 858 and the third threshold voltage 890. In yet another example, the signal 860 is received by the transistor 898 (e.g., at a gate terminal) of which a transistor terminal (e.g., a drain terminal) is coupled, directly or indirectly, to the terminal 392 (e.g., terminal G2). In yet another example, the timing controller 812 receives the signals 870, 860 and 850 and outputs a signal 872 to the logic controller 814 in order to affect the transistor 310. The offset component 804 is omitted in some embodiments.

According to yet another embodiment, the falling-edge-detection component 810 compares the signal 858 with the second threshold voltage 854 (e.g., −300 mV), and if the signal 858 is lower than the second threshold voltage 854, the falling-edge-detection component 810 changes the signal 850 so as to change the signal 366 to a logic high level to turn on the transistor 310. For example, the soft-off regulator 808 compares the signal 858 and the third threshold voltage 890 (e.g., −50 mV), and if the signal 858 is higher than the third threshold voltage 890, the soft-off regulator 808 changes the signal 860 so as to pull low (e.g., decrease in magnitude) the signal 366. As an example, the turn-on resistance of the transistor 310 is increased. The signal 858 is decreased to be lower than the third threshold voltage 890, and in response the soft-off regulator 808 is configured to change the signal 860 so as to hold the signal 362 approximately constant, in some embodiments. For example, the signal 362 fluctuates around the third threshold voltage 890 (e.g., within a small range around the third threshold voltage 890). As an example, the signal 362 fluctuates around the third threshold voltage 890 between a lower limit and an upper limit, where the lower limit is equal to the third threshold voltage 890 minus 10 mV, and the upper limit is equal to the third threshold voltage 890 plus 2 mV. As another example, the third threshold voltage 890 is equal to −50 mV, and the signal 362 fluctuates between −60 mV and −48 mV. In another example, a drain current of the transistor 310 decreases in magnitude, and the signal 362 increases again. When the signal 362 becomes higher than the third threshold voltage 890, the above-noted process repeats, in certain embodiments. For example, the transistor 310 is turned on in response to the signal 366 changing from a logic low level to a logic high level, and is then turned off in response to the signal 366 changing from the logic high level back to the logic low level.

As discussed above and further emphasized here, FIG. 7 is merely an example, which should not unduly limit the scope of the claims. One of ordinary skill in the art would recognize many variations, alternatives, and modifications. For example, the secondary controller 408 is the same as the secondary controller 308 as shown in FIG. 7.

FIG. 8(A) and FIG. 8(B) are simplified timing diagrams for the power conversion system 300 including the secondary controller 308 as shown in FIG. 7 according to an embodiment. This diagram is merely an example, which should not unduly limit the scope of the claims. One of ordinary skill in the art would recognize many variations, alternatives, and modifications. For example, the waveform 902 represents the power switch 330 being turned on or off as a function of time, the waveform 904 represents the voltage signal 362 (e.g., at terminal DR) as a function of time, the waveform 906 represents the signal 366 (e.g., at terminal G2) as a function of time, and the waveform 908 represents the turn-on resistance of the transistor 310 as a function of time. As shown in FIG. 8(A) and FIG. 8(B), an on-time period of the switch 330 (e.g., $T_{on}$) starts at time $t_{30}$ and ends at time $t_{31}$, and an off-time period of the switch 330 (e.g., $T_{off}$) starts at the time $t_{31}$ and ends at time $t_{34}$. In yet another example, $t_{30} \leq t_{31} \leq t_{32} \leq t_{33} \leq t_{34}$.

According to one embodiment, during the on-time period (e.g., $T_{on}$), the switch 330 is closed (e.g., being turned on) as shown by the waveform 902, and the energy is stored in the transformer that includes the primary winding 304 and the secondary winding 306. For example, the voltage signal 362 (e.g., $V_{DR}$) received by the secondary controller 308 has a value 918 which is higher than zero (e.g., as shown by the waveform 904). In another example, the signal 366 is at a logic low level (e.g., as shown by the waveform 906), and the transistor 310 is off. In yet another example, at the end of the on-time period (e.g., at $t_{31}$), the switch 330 is open (e.g., off) as shown by the waveform 902, and the energy is transferred to the secondary side. In yet another example, the voltage signal 362 (e.g., $V_{DR}$) decreases from the value 918 to a value lower than both a first threshold voltage 928 (e.g., $V_{th1}$) and a second threshold voltage 910 (e.g., $V_{th2}$), as shown by the waveform 904. In yet another example, both the first threshold voltage 928 (e.g., $V_{th1}$) and the second threshold voltage 910 (e.g., $V_{th2}$) are lower than a ground voltage 372 (e.g., zero volt). In yet another example, the body diode of the transistor 310 begins to conduct. Thereafter, the signal 366 changes from the logic low level to a logic high level (e.g., at $t_{31}$ as shown by the waveform 906) and the transistor 310 is turned on, in certain embodiments. For example, the turn-on resistance of the transistor 310 decreases in magnitude (e.g., as shown by the waveform 908). In some embodiments, the first threshold voltage 928 (e.g., $V_{th1}$) is equal to −10 mV, and the second threshold voltage 910 (e.g., $V_{th2}$) is equal to −300 mV.

According to another embodiment, after the off-time period begins (e.g., at $t_{31}$), the voltage signal 362 (e.g., $V_{DR}$) increases, and reaches a third threshold voltage 912 (e.g., $V_{th3}$) (e.g., at $t_{32}$ as shown by the waveform 904). For example, the secondary controller 308 is configured to keep the voltage signal 362 (e.g., $V_{DR}$) approximately at the third threshold voltage 912. In another example, the voltage signal 362 (e.g., $V_{DR}$) fluctuates by being equal to the third threshold voltage 912 (e.g., the third threshold voltage 890), or being smaller than or larger than the third threshold voltage 912 but still within a small range around the third threshold voltage 912. As an example, the signal 362 fluctuates around the third threshold voltage 912 between a lower limit and an upper limit, where the lower limit is equal to the third threshold voltage 912 minus 10 mV, and the upper limit is equal to the third threshold voltage 912 plus 2 mV. As another example, the third threshold voltage 912 is equal to −50 mV, and the signal 362 fluctuates between −60 mV and −48 mV.

As shown in FIG. 8(B), the voltage signal 362 fluctuates (e.g., with a small magnitude) around the third threshold voltage 912. As an example, the signal 366 (e.g., at the terminal G2) decreases gradually (e.g., as shown by the waveform 906), and the turn-on resistance of the transistor 310 increases gradually (e.g., as shown by the waveform 908). In another example, when the signal 366 (e.g., at the terminal G2) becomes sufficiently low, the transistor 310 enters a sub-threshold status. In yet another example, the turn-on resistance of the transistor 310 increases (e.g., exponentially, at $t_{33}$ as shown by the waveform 908), and the drain current of the transistor 310 decreases in magnitude. In yet another example, when the drain current drops below a certain threshold (e.g., close to 0), the signal 362 increases to reach the first threshold voltage 928 (e.g., at $t_{33}$ as shown by the waveform 904), and in response the secondary controller 308 is configured to decrease the signal 366 (e.g., at the terminal G2) to approximately 0 (e.g., as shown by the waveform 906) to turn off the transistor 310.

In certain embodiments, the third threshold voltage 912 (e.g., $V_{th3}$) is equal to −50 mV. As an example, the first threshold voltage 928, the second threshold voltage 910, and the third threshold voltage 912 are the same as the first threshold voltage 892, the second threshold voltage 854, and the third threshold voltage 890, respectively. As another example, the first threshold voltage 928 and the second threshold voltage 910 are the same as the first threshold voltage 528 and the second threshold voltage 530 respectively.

In certain embodiments, FIG. 8(A) and FIG. 8(B) are simplified timing diagrams for the power conversion system 400 that includes the secondary controller 408 and operates in the discontinuous conduction mode (DCM). For example, the waveform 902 represents the power switch 430 being turned on or off as a function of time, the waveform 904 represents the voltage signal 462 (e.g., at terminal DR) as a function of time, the waveform 906 represents the signal 466 (e.g., at terminal G2) as a function of time, and the waveform 908 represents the turn-on resistance of the transistor 410 as a function of time. The soft turn-off of the transistor 310 as illustrated in FIG. 7, FIG. 8(A) and/or FIG. 8(B) avoids non-synchronization resulted from a hard turn-off of the transistor 310 (e.g., without the soft-off regulator 890) which may cause large resonance rings among the parasitic body diode of the transistor 310 and the parasitic capacitor of the transistor 310, in some embodiments.

FIG. 9 is a simplified diagram showing certain components of the controller 302 as part of the power conversion system 300 according to an embodiment of the present invention. This diagram is merely an example, which should not unduly limit the scope of the claims. One of ordinary skill in the art would recognize many variations, alternatives, and modifications. The controller 302 includes a comparator 1012, an AND gate 1014, a demagnetization detector 1016, a modulation component 1020, a driving component 1022, an under-voltage-lockout (UVLO) component 1018, a leading-edge-blanking (LEB) component 1026, and an over-current-protection (OCP) component 1024. In addition, the controller 302 includes terminals (e.g., pins) 1002, 1004, 1006, 1008 and 1010. For example, the power switch 330 is a bipolar junction transistor. In another example, the power switch 330 is a field effect transistor.

According to one embodiment, referring back to FIG. 5, certain components of the secondary controller 308 are used for output voltage detection and control to improve dynamic response, including the light-load detector 618, the signal generator 620, the oscillator 622, the reference-signal generator 626, the logic control component 614, and the gate driver 616. For example, the secondary controller 308 continuously monitors the output voltage 350. In another example, the comparator 624 receives a reference signal 680 and the signal 388 (e.g., $V_s$) and outputs a signal 682. In yet another example, the light-load detector 618 receives a clock signal 674 from the oscillator 622 and a signal 676 from the timing controller 612. In yet another example, the signal 676 is associated with the signal 362. In yet another example, the light-load detector 618 outputs a signal 678 which indicates the switching frequency of the power conversion system 300. In yet another example, the signal generator 620 receives the signal 678 and the signal 682 and outputs a signal 684 to the logic control component 614 in order to affect the signal 366. The secondary controller 308 is configured to fire one or more warning pulses in the signal 366 (e.g., at the terminal G2) to improve dynamic response, in certain embodiments. For example, the one or more warning pulses have a short pulse width (e.g., 3 µs) and are of a certain frequency (e.g., 30 kHz).

According to another embodiment, referring back to FIG. 7, certain components of the secondary controller 308 are used for output voltage detection and control to improve dynamic response, including the light-load detector 818, the signal generator 820, the oscillator 822, the reference-signal generator 826, the logic control component 814, and the driving component 816. For example, the secondary controller 308 continuously monitors the output voltage 350. In another example, the comparator 824 receives a reference signal 880 and the output voltage 350 and outputs a signal 882. In yet another example, the light-load detector 818 receives a clock signal 874 from the oscillator 822 and a signal 876 from the timing controller 812. In yet another example, the signal 876 is associated with the signal 362. In yet another example, the light-load detector 818 outputs a signal 878 which indicates the switching frequency of the power conversion system 300. In yet another example, the signal generator 820 receives the signal 878 and the signal 882 and outputs a signal 884 to the logic control component 814 in order to affect the signal 366. The secondary controller 308 is configured to fire one or more warning pulses in the signal 366 (e.g., at the terminal G2) to improve dynamic response, in certain embodiments. For example, the one or more warning pulses have a short pulse width (e.g., 3 µs) and are of a certain frequency (e.g., 30 kHz).

Referring to FIG. 9, the auxiliary winding 324 couples the one or more warning pulses to the controller 302 through a voltage divider including the resistors 322 and 326. For example, the comparator 1012 receives the feedback signal 360 that indicates the warning pulses and a reference signal 1030 and outputs a comparison signal 1034 to the AND gate 1014. In another example, the demagnetization detector 1016 receives the feedback signal 360 and outputs a detection signal 1032 to the AND gate 1014 which generates a signal 1036 to the modulation component 1020. In yet another example, the UVLO component 1018 receives (e.g., from the terminal 1002) a signal 1028 associated with a voltage of the auxiliary winding 324 and outputs a signal 1050 to the modulation component 1020. In yet another example, a current-sensing signal 1040 associated with a primary current 1060 flowing through the primary winding 304 is processed by the LEB component 1026 which generates a signal 1062 to the OCP component 1024. In yet another example, the OCP component 1024 also receives a threshold signal 1042 and outputs a protection signal 1038 to the modulation component 1020 which receives the current-sensing signal 1040 and generates a modulation signal 1066. In yet another example, the driving component 1022 receives the modulation signal 1066 and outputs a drive signal 1044 to affect the power switch 330. In response to the feedback signal 360 that indicates the one or more warning pulses, the controller 302 is configured to increase a switching frequency associated with the drive signal 1044 and/or increase peak values of the primary current 1060.

As discussed above and further emphasized here, FIG. 9 is merely an example, which should not unduly limit the scope of the claims. One of ordinary skill in the art would recognize many variations, alternatives, and modifications. For example, the controller 402 is the same as the controller 302 as shown in FIG. 9.

FIG. 10 is a simplified timing diagram for the power conversion system 300 that includes the controller 302 as shown in FIG. 9 and the secondary controller 308 as shown in FIG. 7 and operates in the discontinuous conduction mode (DCM) according to an embodiment of the present invention. This diagram is merely an example, which should not unduly limit the scope of the claims. One of ordinary skill in the art would recognize many variations, alternatives, and modifications. For example, the waveform 1702 represents the power switch 330 being turned on or off as a function of time, the waveform 1704 represents the feedback signal 360 as a function of time, and the waveform 1706 represents the voltage signal 362 (e.g., at terminal 390) as a function of time. In addition, the waveform 1708 represents the signal 366 (e.g., at terminal 392) as a function of time, and the waveform 1712 represents the output voltage 350 as a function of time.

According to one embodiment, before time $t_{45}$, the power conversion system 300 is under no/light load conditions and the switching frequency of the system 300 is kept low (e.g., lower than a threshold). For example, during an on-time period (e.g., $T_{on}$ between time $t_{41}$ and time $t_{42}$), the switch 330 is closed (e.g., being turned on) as shown by the waveform 1702, and the energy is stored in the transformer that includes the primary winding 304 and the secondary winding 306. In another example, the voltage signal 362 (e.g., at terminal DR) has a value 1714 (e.g., as shown by the waveform 1706), and is clamped by the clamping component 802. In yet another example, the signal 366 (e.g., at terminal G2) is at a logic low level (e.g., as shown by the waveform 1708), and the transistor 310 is off. In yet another example, the output voltage 350 has a value 1718 (e.g., as shown by the waveform 1712).

According to yet another embodiment, at the end of the on-time period (e.g., at $t_{42}$), the switch 330 is open (e.g., off) as shown by the waveform 1702, and the energy is transferred to the secondary side. For example, the voltage signal 362 decreases from the value 1714 to a value lower than both a first threshold voltage 1722 and a second threshold voltage 1724 (e.g., as shown by the waveform 1706). In another example, both the first threshold voltage 1722 and the second threshold voltage 1724 are lower than a ground voltage 372. In yet another example, the body diode of the transistor 310 begins to conduct, and the body-diode current 370 increases in magnitude. Thereafter, the signal 366 changes from the logic low level to a logic high level (e.g., at $t_{42}$ as shown by the waveform 1708), and the transistor 310 is turned on in certain embodiments. For example, the first threshold voltage 1722 and the second threshold voltage 1724 are the same as the first threshold voltage 528 and the second threshold voltage 530, respectively. In another example, the first threshold voltage 1722 and the second threshold voltage 1724 are the same as the first threshold voltage 928 and the second threshold voltage 910, respectively. In another example, the first threshold voltage 1722 and the second threshold voltage 1724 are the same as the first threshold voltage 892 and the second threshold voltage 854, respectively.

According to yet another embodiment, after the on-time period (e.g., at $t_{42}$), the voltage signal 362 (e.g., $V_{DR}$) increases and reaches a third threshold voltage 1726 (e.g., at $t_{43}$ as shown by the waveform 1706). For example, the secondary controller 308 is configured to keep the voltage signal 362 (e.g., $V_{DR}$) approximately at the third threshold voltage 1726. As an example, the signal 366 (e.g., at the terminal G2) decreases gradually (e.g., as shown by the waveform 1708), and the turn-on resistance of the transistor 310 increases gradually. In another example, when the signal 366 (e.g., at the terminal G2) becomes sufficiently low, the transistor 310 enters a sub-threshold status and the drain current decreases in magnitude. In yet another example, when the drain current drops below a certain threshold (e.g., close to 0), the signal 366 increases to reach the first threshold voltage 1722 (e.g., at $t_{44}$ as shown by the waveform 1706), and in response the secondary controller is configured to decrease the signal 366 (e.g., at the terminal G2) to approximately 0 (e.g., as shown by the waveform 1708) to turn off the transistor 310. In yet another example, the body diode of the transistor 310 begins to conduct again. Thus, the energy is completely delivered to the output in some embodiments. For example, the third threshold voltage 1726 is the same as the third threshold voltage 912. In another example, the third threshold voltage 1726 is the same as the third threshold voltage 890.

In one embodiment, under certain circumstances, when the output load conditions changes from no/light load conditions to full load conditions, the output voltage 350 decreases (e.g., below a threshold level). For example, if the output voltage 350 changes from a first value larger than the reference signal 880 in magnitude to a second value lower than the reference signal 880 in magnitude, the comparator 824 generates a pulse in the signal 882 in order to turn on the transistor 310 during a short time period. In some embodiments, if the signal 878 indicates that the power conversion system 300 is under no/light load conditions, the signal generator 820 outputs a pulse in the signal 884, and in response the gate driver 816 generates a pulse 1730 in the signal 366 (e.g., between $t_{45}$ and $t_{46}$ as shown by the waveform 1708). For example, the signal 362 (e.g., at terminal DR) decreases to a value 1728 (e.g., between $t_{45}$ and $t_{46}$ as shown by the waveform 1706). In yet another example, the transistor 310 is turned on during a pulse period associated with the pulse 1730 in the signal 366, and the channel current 368 flows in a reverse direction (e.g., from the output capacitor 312 through the transistor 310 to ground). In yet another example, the feedback signal 360 increases in magnitude, and forms a pulse (e.g., between $t_{45}$ and $t_{46}$ as shown by the waveform 1704). The controller 302 detects the pulse of the feedback signal 360 (e.g., between $t_{45}$ and $t_{46}$) and, in response, increases one or more peak values of the primary current 1060 of the primary winding 304 and the switching frequency in order to deliver more energy to the secondary side according to certain embodiments. In other embodiments, the controller 302 increases the peak values of the primary current 1060 and the switching frequency upon detection of a second pulse of the feedback signal 360 (e.g., between $t_{47}$ and $t_{48}$). For example, the output voltage 350 increases in magnitude eventually (e.g., at $t_{49}$ as shown by the waveform 1712). In certain embodiments, the pulse 1730 is not fired until after a blanking period (e.g., Tblnk, between $t_{42}$ and $t_{45}$) to avoid affecting the normal primary side switching.

In certain embodiments, FIG. 10 is a simplified timing diagram for the power conversion system 400 that includes the secondary controller 408 and operates in the discontinuous conduction mode (DCM). For example, the waveform 1702 represents the power switch 430 being turned on or off as a function of time, the waveform 1704 represents the feedback signal 460 as a function of time, and the waveform 1706 represents the voltage signal 462 as a function of time. In addition, the waveform 1708 represents the signal 466 as a function of time, and the waveform 1712 represents the output voltage 450 as a function of time.

In some embodiments, the secondary controller 308 as part of the power conversion system 300 or the secondary controller 408 as part of the power conversion system 400 operating in other modes, such as a continuous conduction mode and the critical conduction mode (e.g., the quasi-resonant mode), can also implement the scheme as illustrated in FIG. 7, FIG. 8(A), FIG. 8(B), FIG. 9, and FIG. 10.

According to another embodiment, a system controller for regulating a power conversion system includes a first controller terminal and a second controller terminal. The system controller is configured to receive at least an input signal at the first controller terminal, and generate a gate drive signal at the second controller terminal based on at least information associated with the input signal to turn on or off a transistor in order to affect a current associated with a secondary winding of the power conversion system. The system controller is further configured to, if the input signal is larger than a first threshold, generate the gate drive signal at a first logic level to turn off the transistor, and if the input signal changes from a first value larger than a second threshold to a second value smaller than the second threshold, change the gate drive signal from the first logic level to a second logic level to turn on the transistor. For example, the system is implemented according to FIG. 3(A), FIG. 3(B), FIG. 4, FIG. 5, and/or FIG. 6.

According to another embodiment, a system controller for regulating a power conversion system includes a first controller terminal and a second controller terminal. The system controller is configured to receive at least an input signal at the first controller terminal, the input signal being proportional to an output voltage associated with a secondary winding of the power conversion system, and generate a gate drive signal at the second controller terminal based on at least information associated with the input signal to turn on or off a transistor in order to affect a current associated with the secondary winding of the power conversion system. The system controller is further configured to, only if the input signal changes from a first value larger than a first threshold to a second value smaller than the first threshold, generate a pulse of the gate drive signal to turn on the transistor during a pulse period associated with the pulse. For example, the system is implemented according to at least FIG. 3(A), FIG. 3(B), FIG. 5, and/or FIG. 6.

According to yet another embodiment, a system controller for regulating a power conversion system includes a first comparator, a signal detector, and a driving component. The first comparator is configured to receive an input signal and output a first comparison signal based on at least information associated with the input signal. The signal detector is configured to receive the input signal and output a first detection signal based on at least information associated with the input signal. The driving component is configured to output a gate drive signal based on at least information associated with the first comparison signal and the first detection signal to turn on or off a transistor in order to affect a current associated with a secondary winding of the power conversion system. The comparator is further configured to determine whether the input signal is larger than a first threshold. The signal detector is further configured to determine whether the input signal changes from a first value larger than a second threshold to a second value smaller than the second threshold. The driving component is further configured to, if the first comparison signal indicates the input signal is larger than the first threshold, generate the gate drive signal at a first logic level to turn off the transistor, and if the first detection signal indicates the input signal changes from the first value larger than the second threshold to the second value smaller than the second threshold, change the gate drive signal from the first logic level to a second logic level to turn on the transistor. For example, the system is implemented according to FIG. 3(A), FIG. 3(B), FIG. 4, FIG. 5, and/or FIG. 6.

In one embodiment, a system controller for regulating a power conversion system includes a comparator, a pulse signal generator, and a driving component. A comparator is configured to receive an input signal and output a comparison signal based on at least information associated with the input signal. The pulse signal generator is configured to receive at least the comparison signal and generate a pulse signal based on at least information associated with the comparison signal. The driving component is configured to receive the pulse signal and generate a gate drive signal based on at least information associated with the pulse signal to turn on or off a transistor in order to affect a current associated with the secondary winding of the power conversion system. The comparator is further configured to determine whether the input signal is larger than or smaller than a threshold. The pulse signal generator is further configured to, only if the comparison signal indicates the input signal changes from a first value larger than the threshold to a second value smaller than the threshold, generate a first pulse of the pulse signal. The driving component is further configured to, in response to the first pulse of the pulse signal, generate a second pulse of the gate drive signal to turn on the transistor during a pulse period associated with the second pulse. For example, the system is implemented according to at least FIG. 3(A), FIG. 3(B), FIG. 5, and/or FIG. 6.

In another embodiment, a method for regulating a power conversion system includes receiving at least an input signal, processing information associated with the input signal, and generating a gate drive signal based on at least information associated with the input signal to turn on or off a transistor in order to affect a current associated with a secondary winding of the power conversion system. The process for generating a gate drive signal based on at least information associated with the input signal to turn on or off a transistor in order to affect a current associated with a secondary winding of the power conversion system includes, if the input signal is larger than a first threshold, generating the gate drive signal at a first logic level to turn off the transistor, and if the input signal changes from a first value larger than a second threshold to a second value smaller than the second threshold, changing the gate drive signal from the first logic level to a second logic level to turn on the transistor. For example, the method is implemented according to FIG. 3(A), FIG. 3(B), FIG. 4, FIG. 5, and/or FIG. 6.

In yet another embodiment, a method for regulating a power conversion system includes receiving at least an input signal, the input signal being proportional to an output voltage associated with a secondary winding of the power conversion system, processing information associated with the input signal, and generating a gate drive signal based on at least information associated with the input signal to turn on or off a transistor in order to affect a current associated with the secondary winding of the power conversion system. The process for generating a gate drive signal based on at least information associated with the input signal to turn on or off a transistor in order to affect a current associated with the secondary winding of the power conversion system includes, only if the input signal changes from a first value larger than a first threshold to a second value smaller than the first threshold, generating a pulse of the gate drive signal to turn on the transistor during a pulse period associated with the pulse. For example, the method is implemented according to at least FIG. 3(A), FIG. 3(B), FIG. 5, and/or FIG. 6.

In yet another embodiment, a method for regulating a power conversion system includes receiving an input signal, processing information associated with the input signal, and determining whether the input signal is larger than a first threshold. The method further includes generating a comparison signal based on at least information associated with the input signal, determining whether the input signal changes from a first value larger than a second threshold to a second value smaller than the second threshold, and generating a detection signal based on at least information associated with the input signal. In addition, the method includes outputting a gate drive signal based on at least information associated with the comparison signal and the detection signal to turn on or off a transistor in order to affect a current associated with a secondary winding of the power conversion system. The process for outputting a gate drive signal based on at least information associated with the comparison signal and the detection signal to turn on or off a transistor in order to affect a current associated with a secondary winding of the power conversion system includes, if the comparison signal indicates the input signal is larger than the first threshold, generating the gate drive signal at a first logic level to turn off the transistor, and if the detection signal indicates the input signal changes from the first value larger than the second threshold to the second value smaller than the second threshold, changing the gate drive signal from the first logic level to a second logic level to turn on the transistor. For example, the method is implemented according to FIG. 3(A), FIG. 3(B), FIG. 4, FIG. 5, and/or FIG. 6.

In yet another embodiment, a method for regulating a power conversion system includes receiving an input signal, processing information associated with the input signal, and determining whether the input signal is larger than or smaller than a threshold. The method further includes generating a comparison signal based on at least information associated with the first input signal, receiving the comparison signal, and processing information associated with the comparison signal. In addition, the method includes generating a pulse signal based on at least information associated with the comparison signal, receiving the pulse signal, processing information associated with the pulse signal, and generating a gate drive signal based on at least information associated with the pulse signal to turn on or off a transistor in order to affect a current associated with the secondary winding of the power conversion system. The process for generating a pulse signal based on at least information associated with the comparison signal includes, only if the comparison signal indicates the input signal changes from a first value larger than the threshold to a second value smaller than the threshold, generating a first pulse of the pulse signal. The process for generating a gate drive signal based on at least information associated with the pulse signal to turn on or off a transistor in order to affect a current associated with the secondary winding of the power conversion system includes, in response to the first pulse of the pulse signal, generate a second pulse of the gate drive signal to turn on the transistor during a pulse period associated with the second pulse. For example, the method is implemented according to at least FIG. 3(A), FIG. 3(B), FIG. 5, and/or FIG. 6.

According to one embodiment, a system controller for regulating a power conversion system includes: a first controller terminal and a second controller terminal. The system controller is configured to: receive an input signal at the first controller terminal; and generate a first drive signal at the second controller terminal based on at least information associated with the input signal to turn on or off a transistor to affect a current associated with a secondary winding of the power conversion system. The system controller is further configured to: in response to the input signal changing from a first value larger than a first threshold to a second value smaller than the first threshold, change the first drive signal from a first logic level to a second logic level to turn on the transistor; in response to the input signal changing from the second value to a second threshold, change the first drive signal to keep the input signal approximately at the second threshold; and in response to the input signal becoming larger than a third threshold, generate the first drive signal at the first logic level to turn off the transistor. For example, the system controller is implemented according to at least FIG. 7, FIG. 8, and/or FIG. 9.

According to another embodiment, a system for regulating a power conversion system includes: a first system controller and a second system controller. The first system controller is configured to: receive an input signal associated with an output voltage related to a secondary winding of a power conversion system; and generate a first drive signal based on at least information associated with the input signal to turn on or off a transistor to affect a first current associated with the secondary winding of the power conversion system. The second system controller configured to: receive a feedback signal associated with the first drive signal; generate a second drive signal based on at least information associated with the feedback signal; and output the second drive signal to a switch to affect a second current flowing through a primary winding of the power conversion system. The first system controller is further configured to, in response to the input signal indicating that the output voltage changes from a first value larger than a first threshold to a second value smaller than the first threshold, generate one or more pulses of the first drive signal to turn on and off the transistor. The second system controller is further configured to: process the feedback signal to detect the one or more pulses of the first drive signal; and in response to the one or more pulses of the first drive signal being detected, increase a switching frequency associated with the second drive signal. The second system controller includes: a detection component configured to receive the feedback signal, detect the one or more pulses of the first drive signal based on at least information associated with the feedback signal, and output a detection signal based on at least information associated with the detected one or more pulses, a signal generator configured to receive the detection signal and output a modulation signal based on at least information associated with the detection signal, and a drive component configured to receive the modulation signal and output the second drive signal to the switch. For example, the system is implemented according to at least FIG. 3(A), FIG. 3(B), FIG. 5, FIG. 6, and/or FIG. 9.

In one embodiment, a method for regulating a power conversion system, the method comprising: receiving an input signal; processing information associated with the input signal; and generating a first drive signal based on at least information associated with the input signal to turn on or off a transistor to affect a current associated with a secondary winding of the power conversion system. The generating a first drive signal based on at least information associated with the input signal includes: in response to the input signal changing from a first value larger than a first threshold to a second value smaller than the first threshold, changing the first drive signal from a first logic level to a second logic level to turn on the transistor; in response to the input signal changing from the second value to a second threshold, changing the first drive signal to keep the input signal approximately at the second threshold; and in response to the input signal becoming larger than a third threshold, generating the first drive signal at the first logic level to turn off the transistor. For example, the method is implemented according to at least FIG. 7, FIG. 8, and/or FIG. 9.

In another embodiment, a method for regulating a power conversion system includes: receiving an input signal associated with an output voltage related to a secondary winding of a power conversion system; processing information associated with the input signal; generating a first drive signal based on at least information associated with the input signal to turn on or off a transistor to affect a first current associated with the secondary winding of the power conversion system; receiving a feedback signal associated with the first drive signal; processing information associated with the feedback signal; generating a second drive signal based on at least information associated with the feedback signal; and outputting the second drive signal to a switch to affect a second current flowing through a primary winding of the power conversion system. The generating a first drive signal based on at least information associated with the input signal includes, in response to the input signal indicating that the output voltage changing from a first value larger than a first threshold to a second value smaller than the first threshold, generating one or more pulses of the first drive signal to turn on and off the transistor. The processing information associated with the feedback signal includes: processing the feedback signal; detecting the one or more pulses of the first drive signal based on at least information associated with the feedback signal; and outputting a detection signal based on at least information associated with the detected one or more pulses. The generating a second drive signal based on at least information associated with the feedback signal includes: receiving the detection signal; outputting a modulation signal based on at least information associated with the detection signal; receiving the modulation signal; and generating the second drive signal based on at least information associated with the modulation signal. The generating a second drive signal based on at least information associated with the feedback signal further includes, in response to the one or more pulses of the first drive signal being detected, increasing a switching frequency associated with the second drive signal. For example, the method is implemented according to at least FIG. 3(A), FIG. 3(B), FIG. 5, FIG. 6, and/or FIG. 9.

For example, some or all components of various embodiments of the present invention each are, individually and/or in combination with at least another component, implemented using one or more software components, one or more hardware components, and/or one or more combinations of software and hardware components.

In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system controller for regulating a power conversion system, the system controller comprising:
a first controller terminal; and
a second controller terminal;
wherein the system controller is configured to:
receive an input signal at the first controller terminal; and
generate a first drive signal at the second controller terminal based on at least information associated with the input signal to turn on or off a transistor to affect a first current associated with a secondary winding of the power conversion system;
wherein the system controller is further configured to:
in response to the input signal changing from a first value larger than a first threshold to a second value smaller than the first threshold, change the first drive signal from a first logic level to a second logic level to turn on the transistor;
in response to the input signal changing from the second value to a second threshold, change the first drive signal to keep the input signal approximately at the second threshold; and
in response to the input signal becoming larger than a third threshold, generate the first drive signal at the first logic level to turn off the transistor.

2. The system controller of claim 1 is further configured to output the first drive signal to a gate terminal of the transistor.

3. The system controller of claim 1 is further configured to receive the input signal from a drain terminal of the transistor.

4. The system controller of claim 3 is further configured to, in response to the input signal changing from the second value to the second threshold,
decrease the first drive signal to keep the input signal approximately at the second threshold until a drain current associated with the drain terminal is reduced below a predetermined current threshold; and
in response to the drain current being reduced below the predetermined current threshold, change the first drive signal to turn off the transistor.

5. The system controller of claim 1 is further configured to, in response to the input signal changing from the second value to the second threshold, change the first drive signal so that the input signal fluctuates around the second threshold within a range.

6. The system controller of claim 1 wherein the third threshold is higher than the second threshold, and the second threshold is higher than the first threshold.

7. The system controller of claim 1 wherein the third threshold is equal to −10 mV.

8. The system controller of claim 1 wherein the third threshold is equal to 0 mV.

9. The system controller of claim 1 wherein the second threshold is equal to −50 mV.

10. The system controller of claim 1 wherein the third threshold is equal to −300 mV.

11. The system controller of claim 1 is further configured to, in response to the input signal indicating that an output voltage changes from a fourth value larger than a fourth threshold to a fifth value smaller than the fourth threshold, generate one or more pulses of the first drive signal to turn on and off the transistor, the output voltage being related to the secondary winding of the power conversion system;
wherein the one or more pulses of the first drive signal are detected by a detection-and-drive controller configured to:
receive a feedback signal associated with the output voltage;
generate a second drive signal based on at least information associated with the feedback signal;

output the second drive signal to a switch to affect a second current flowing through a primary winding of the power conversion system; and in response to the one or more pulses of the first drive signal being detected, increase a switching frequency associated with the second drive signal and increase one or more peak values of the second current flowing through the primary winding.

12. The system controller of claim 1, and further comprising:
a first detection component configured to receive a first reference signal associated with the first threshold and the input signal and generate a first detection signal based on at least information associated with the input signal and the first reference signal;
a soft-turn-off component configured to receive a second reference signal associated with the second threshold and the input signal and generate a second detection signal based on at least information associated with the input signal and the second reference signal; and
a second detection component configured to receive a third reference signal associated with the third threshold and the input signal and generate a third detection signal based on at least information associated with the input signal and the third reference signal.

13. The system controller of claim 12, and further comprising:
a timing-control component configured to receive the first detection signal, the second detection signal and the third detection signal and output a timing signal based on at least information associated with the first detection signal, the second detection signal and the third detection signal;
a logic controller configured to receive the timing signal and output a control signal based on at least information associated with the timing signal; and
a drive component configured to output the first drive signal at the second controller terminal based on at least information associated with the control signal.

14. The system controller of claim 12 wherein the first detection component is further configured to determine whether the input signal changes from the first value larger than the first threshold to the second value smaller than the first threshold.

15. The system controller of claim 12 wherein the soft-turn-off component is further configured to determine whether the input signal changes from the second value to the second threshold.

16. The system controller of claim 12 wherein the second detection component is further configured to determine whether the input signal becomes larger than the third threshold.

17. The system controller of claim 12 wherein the first detection component includes:
an offset component configured to receive the input signal and output an offset signal based on at least information associated with the input signal; and
a comparator configured to receive the offset signal and the first reference signal and output the first detection signal based on at least information associated with the offset signal and the first reference signal.

18. The system controller of claim 12 wherein the second detection component includes:
an offset component configured to receive the input signal and output an offset signal based on at least information associated with the input signal; and
a comparator configured to receive the offset signal and the third reference signal and output the third detection signal based on at least information associated with the offset signal and the third reference signal.

19. A system for regulating a power conversion system, the system comprising:
a first system controller configured to:
receive an input signal associated with an output voltage related to a secondary winding of a power conversion system; and
generate a first drive signal based on at least information associated with the input signal to turn on or off a transistor to affect a first current associated with the secondary winding of the power conversion system; and
a second system controller configured to:
receive a feedback signal associated with the first drive signal;
generate a second drive signal based on at least information associated with the feedback signal; and
output the second drive signal to a switch to affect a second current flowing through a primary winding of the power conversion system;
wherein:
the first system controller is further configured to, in response to the input signal indicating that the output voltage changes from a first value larger than a threshold to a second value smaller than the threshold, generate one or more pulses of the first drive signal to turn on and off the transistor; and
the second system controller is further configured to:
process the feedback signal to detect the one or more pulses of the first drive signal; and
in response to the one or more pulses of the first drive signal being detected, increase a switching frequency associated with the second drive signal;
wherein the second system controller includes:
a detection component configured to receive the feedback signal, detect the one or more pulses of the first drive signal based on at least information associated with the feedback signal, and output a detection signal based on at least information associated with the detected one or more pulses;
a signal generator configured to receive the detection signal and output a modulation signal based on at least information associated with the detection signal; and
a drive component configured to receive the modulation signal and output the second drive signal to the switch.

20. The system of claim 19 wherein the detection component includes:
a comparator configured to receive the feedback signal and a reference signal and generate a comparison signal based on at least information associated with the feedback signal and the reference signal;
a demagnetization detector configured to receive the feedback signal and output a demagnetization signal based on at least information associated with the feedback signal; and
an AND gate configured to receive the comparison signal and the demagnetization signal and output the detection signal based on at least information associated with the comparison signal and the demagnetization signal.

21. The system of claim 19 wherein the second system controller is further configured to, in response to the one or more pulses of the first drive signal being detected, increase one or more peak values of the second current flowing through the primary winding.

22. A method for regulating a power conversion system, the method comprising:
- receiving an input signal;
- processing information associated with the input signal; and
- generating a first drive signal based on at least information associated with the input signal to turn on or off a transistor to affect a current associated with a secondary winding of the power conversion system;
- wherein the generating a first drive signal based on at least information associated with the input signal includes:
  - in response to the input signal changing from a first value larger than a first threshold to a second value smaller than the first threshold, changing the first drive signal from a first logic level to a second logic level to turn on the transistor;
  - in response to the input signal changing from the second value to a second threshold, changing the first drive signal to keep the input signal approximately at the second threshold; and
  - in response to the input signal becoming larger than a third threshold, generating the first drive signal at the first logic level to turn off the transistor.

23. A method for regulating a power conversion system, the method comprising:
- receiving an input signal associated with an output voltage related to a secondary winding of a power conversion system;
- processing information associated with the input signal;
- generating a first drive signal based on at least information associated with the input signal to turn on or off a transistor to affect a first current associated with the secondary winding of the power conversion system;
- receiving a feedback signal associated with the first drive signal;
- processing information associated with the feedback signal;
- generating a second drive signal based on at least information associated with the feedback signal; and
- outputting the second drive signal to a switch to affect a second current flowing through a primary winding of the power conversion system;

wherein:
- the generating a first drive signal based on at least information associated with the input signal includes, in response to the input signal indicating that the output voltage changing from a first value larger than a threshold to a second value smaller than the threshold, generating one or more pulses of the first drive signal to turn on and off the transistor;
- the processing information associated with the feedback signal includes:
  - processing the feedback signal;
  - detecting the one or more pulses of the first drive signal based on at least information associated with the feedback signal; and
  - outputting a detection signal based on at least information associated with the detected one or more pulses;
- the generating a second drive signal based on at least information associated with the feedback signal includes:
  - receiving the detection signal;
  - outputting a modulation signal based on at least information associated with the detection signal;
  - receiving the modulation signal; and
  - generating the second drive signal based on at least information associated with the modulation signal; and
- the generating a second drive signal based on at least information associated with the feedback signal further includes, in response to the one or more pulses of the first drive signal being detected, increasing a switching frequency associated with the second drive signal.

24. The method of claim 23 wherein the generating a second drive signal based on at least information associated with the feedback signal further includes, in response to the one or more pulses of the first drive signal being detected, increasing one or more peak values of the second current flowing through the primary winding.

* * * * *